(12) United States Patent
Ito

(10) Patent No.: US 7,941,702 B2
(45) Date of Patent: May 10, 2011

(54) ELECTRONIC CONTROL UNIT

(75) Inventor: Akira Ito, Nukata-gun (JP)

(73) Assignee: DENSO Corporation, Kariya (JP)

( * ) Notice: Subject to any disclaimer, the term of this patent is extended or adjusted under 35 U.S.C. 154(b) by 441 days.

(21) Appl. No.: 12/073,938

(22) Filed: Mar. 12, 2008

(65) Prior Publication Data

US 2008/0229151 A1 Sep. 18, 2008

(30) Foreign Application Priority Data

Mar. 14, 2007 (JP) ................................ 2007-065625

(51) Int. Cl.
*G06F 15/00* (2006.01)
(52) U.S. Cl. ................. 714/30; 714/27; 714/37; 714/47
(58) Field of Classification Search ..................... 714/27, 714/30, 37
See application file for complete search history.

(56) References Cited

U.S. PATENT DOCUMENTS

| | | | | |
|---|---|---|---|---|
| 5,880,568 A | * | 3/1999 | Bederna et al. | 318/563 |
| 6,125,322 A | * | 9/2000 | Bischof et al. | 701/114 |
| 6,243,629 B1 | * | 6/2001 | Sugimoto et al. | 701/29 |
| 2002/0032516 A1 | * | 3/2002 | Shimada et al. | 701/114 |
| 2003/0163772 A1 | * | 8/2003 | Jaworski | 714/704 |
| 2004/0158779 A1 | * | 8/2004 | Kabune et al. | 714/55 |
| 2004/0172580 A1 | * | 9/2004 | Kabune et al. | 714/699 |
| 2004/0254766 A1 | * | 12/2004 | Ito | 702/188 |
| 2005/0039149 A1 | * | 2/2005 | Imada et al. | 716/1 |

FOREIGN PATENT DOCUMENTS

| | | |
|---|---|---|
| EP | 0 704 343 | 4/1996 |
| JP | 5-151017 | 6/1993 |

OTHER PUBLICATIONS

Japanese Office Action dated Jan. 6, 2009 issued in corresponding Japanese Application No. 2007-065625, with English translation.
Extended European Search Report dated Apr. 15, 2009, issued in corresponding European Application No. 08004501.6-2206.
Office Action (5 pgs.) dated Nov. 2, 2010 issued in corresponding European Application No. 08 004 501.6-2206.

* cited by examiner

*Primary Examiner* — Scott T Baderman
*Assistant Examiner* — Chae Ko
(74) *Attorney, Agent, or Firm* — Nixon & Vanderhye P.C.

(57) ABSTRACT

An ECU that controls an engine of a vehicle includes a MPU and an IC that monitors the operation of the MPU. The MPU is programmed to execute a verification result check and test selection function for selecting a test for verifying the function of the MPU. The MPU runs the selected test, and transmits a test result indicating the result of the test to the IC. The IC checks whether the test result from the MPU is correct or incorrect, and transmits a verification result to the MPU.

19 Claims, 23 Drawing Sheets

FIG. 9A

ID=1, ID=2 : NORMAL MODE TEST
ID=3, ID=4 : FAIL-SAFE MODE TEST

| TEST ID / FUNCTION | ID=1 | ID=2 | ID=3 | ID=4 |
|---|---|---|---|---|
| #1 | 01 | 11 | 21 | 31 |
| #2 | 02 | 12 | 22 | 32 |
| ⋮ | ⋮ | ⋮ | ⋮ | ⋮ |
| #16 | 10 | 20 | 30 | 40 |

FIG. 9B

ID=5 : IC TEST

| ID=5 (NG CONFIRM) | ID=5 (OK CONFIRM) |
|---|---|
| FF | 41 |
| FF | 42 |
| ⋮ | ⋮ |
| FF | 50 |

FIG. 12

| TEST ID / FUNCTION | ID=1 | ID=2 | ID=3 | ID=4 | ID=5 |
|---|---|---|---|---|---|
| #1 | 01 | 11 | 21 | 31 | 41 |
| #2 | 02 | 12 | 22 | 32 | 42 |
| ⋮ | ⋮ | ⋮ | ⋮ | ⋮ | ⋮ |
| #16 | 10 | 20 | 30 | 40 | 50 |

| TEST ID FUNCTION | ID=1 | ID=2 | ID=3 | ID=4 |
|---|---|---|---|---|
| #1 | 01 | 11 | 21 | 31 |
| #2 | 02 | 12 | 22 | 32 |
| ⋮ | ⋮ | ⋮ | ⋮ | ⋮ |
| #16 | 10 | 20 | 30 | 40 |

US 7,941,702 B2

ELECTRONIC CONTROL UNIT

CROSS REFERENCE TO RELATED APPLICATION

This application is based on and incorporates herein by reference Japanese Patent Application No. 2007-65625 filed on Mar. 14, 2007.

FIELD OF THE INVENTION

The present invention relates to an electronic control unit that includes a microcomputer and an integrated circuit monitoring the operation of the microcomputer.

BACKGROUND OF THE INVENTION

Conventional electronic control units for vehicles are provided with functions of monitoring the operation of a microcomputer mounted therein as disclosed in JP 1998-507805A (U.S. Pat. No. 5,880,568) and JP 1999-505587A (U.S. Pat. No. 6,125,322). These electronic control units include a monitoring integrated circuit (IC) in addition to the microcomputer so that queries are transmitted from the monitor IC to the microcomputer. The microcomputer runs a test corresponding to a query from the monitor IC and transmits the result of the test to the monitor IC as a reply. The monitor IC compares the reply from the microcomputer with an expected value within the monitor IC to monitor the operation of the microcomputer.

The monitor IC is constructed to select a query to the microcomputer (that is, a test to be run in the microcomputer) and compare a reply from the microcomputer for the query with an expected value. As a result, the monitor IC needs to have a function to process replies from the microcomputer and a function to select a query, with the result that the construction of the monitor IC is complicated.

Furthermore, since the monitor IC separate from the microcomputer selects a query, it is difficult to achieve an attempt to run a test suitable for a current control mode in the microcomputer, for example. Since the monitor IC cannot recognize control modes of the microcomputer, it is impossible to select a query so that a test suitable for a current control mode is run.

SUMMARY OF THE INVENTION

The present invention therefore has an object to provide an electronic control unit that can simplify the function of a monitor IC to monitor the operation of a microcomputer, and readily select tests suitable for control modes.

According to one aspect of the present invention, an electronic control unit comprises a microcomputer and an integrated circuit (IC). The microcomputer performs processing for controlling a control target, and the IC monitors operation of the microcomputer. The microcomputer is programmed to select a test to verify functions of the microcomputer, run the selected test and transmit a test reply as a test result indicating a result of the test to the IC. The IC checks whether the test result transmitted from the microcomputer is correct or incorrect, thus monitoring the microcomputer operation.

BRIEF DESCRIPTION OF THE DRAWINGS

The above and other objects, features and advantages of the present invention will become more apparent from the following detailed description made with reference to the accompanying drawings. In the drawings:

FIGS. 9A and 9B are tables showing the rules of creating a test result in an MPU;

FIG. 12 is a table showing the rules of setting an expected value for determining correctness or incorrectness in the monitor IC;

DETAILED DESCRIPTION OF THE PREFERRED EMBODIMENTS

First Embodiment

Figure 1:
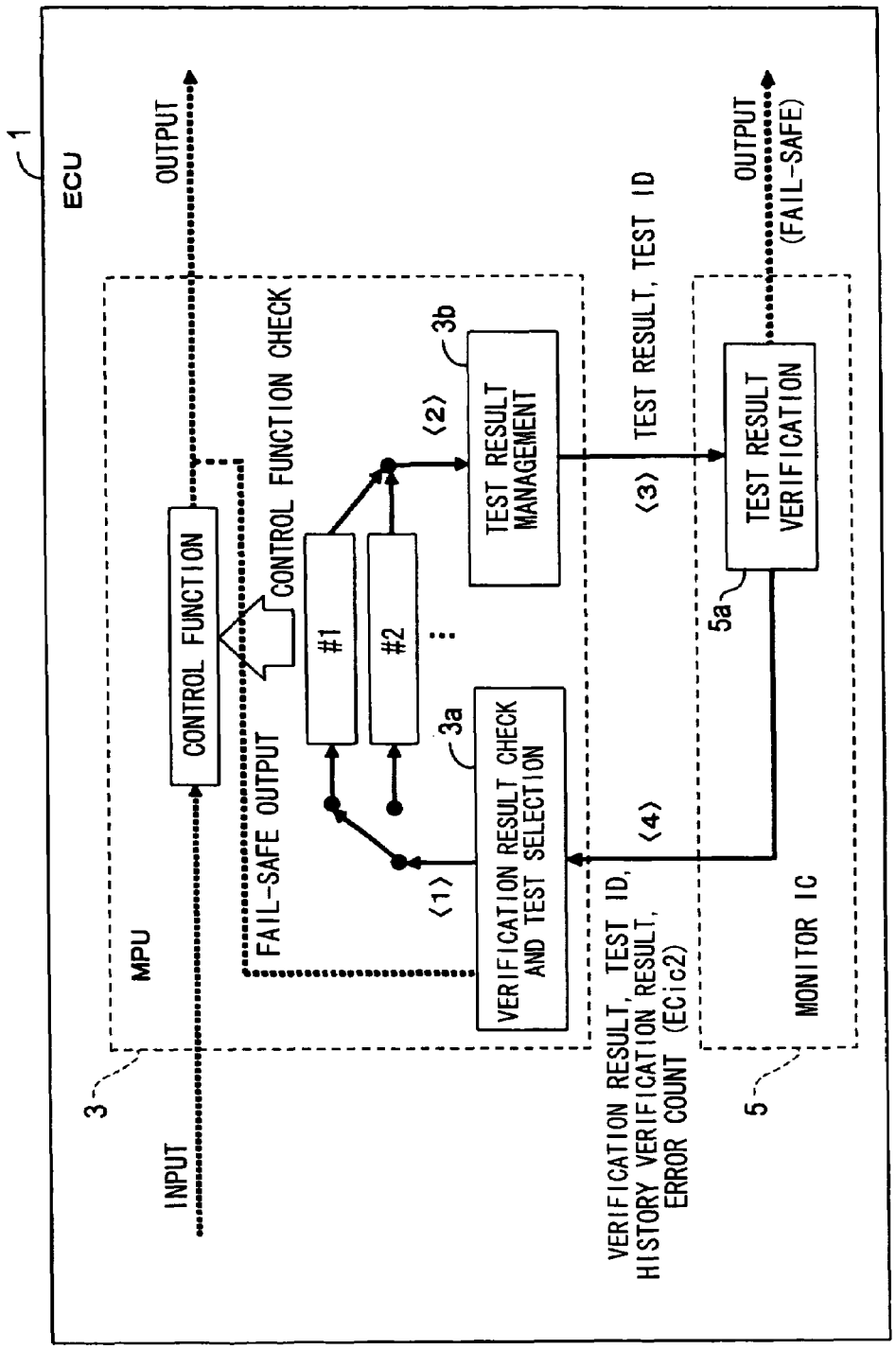
FIG. 1 is a block diagram showing an ECU of a first embodiment of the present invention.

As shown in FIG. 1, an electronic control unit (ECU) 1 includes a micro-processing unit (MPU) 3 as a microcomputer that performs various processing programmed for controlling an engine of a vehicle, and a monitor IC 5 that monitors the operation of MPU 3.

The MPU 3, for example, determines the control amount of an actuator for actuating the engine based on input information from various sensors and the like, and performs control processing for achieving such various control functions. Programs for achieving control functions of such control processing are pre-stored in a ROM (not shown).

Figure 2:
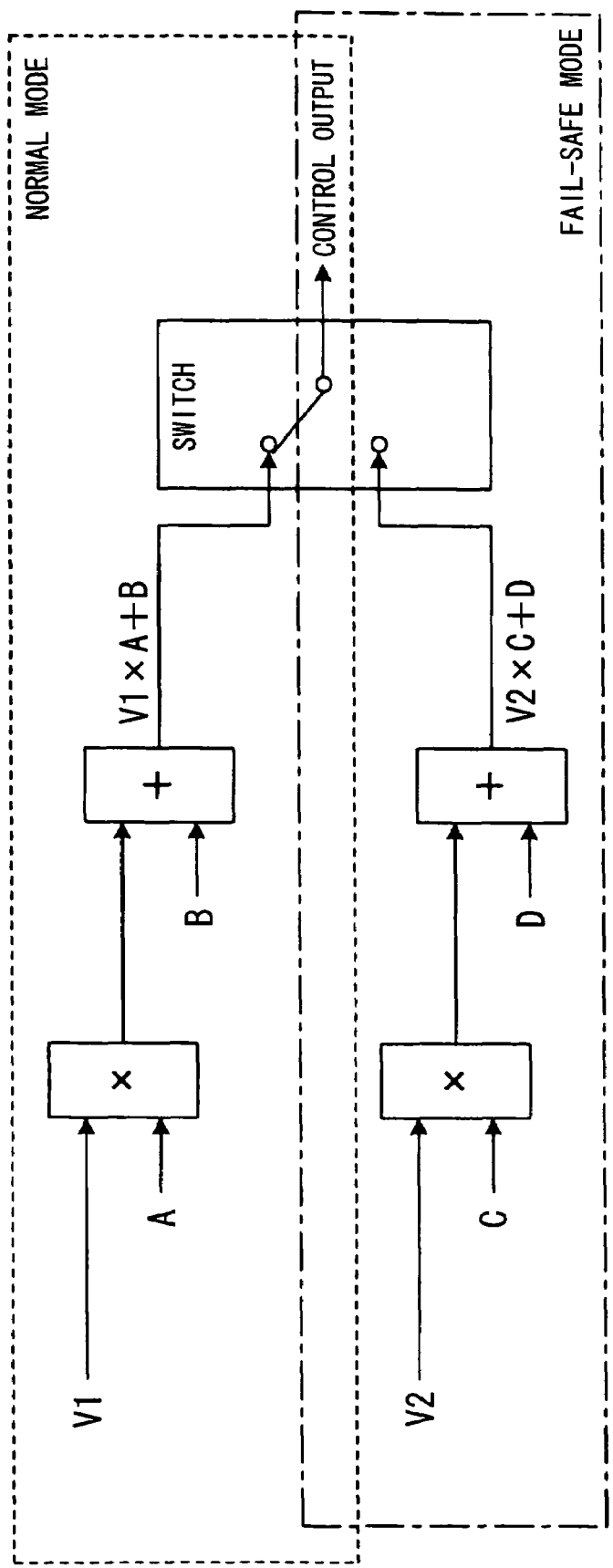
FIG. 2 is a schematic diagram illustrating an example of a control function of an MPU.

For example, as one of control functions, an actuator control amount computation function as shown in FIG. 2 is available. This actuator control amount computation function performs an operation "V1× constant A+constant B" for a voltage V1 inputted from the main signal input system, when the main of main and sub signal input systems (not shown) provided in the ECU 1 is normal and the MPU 3 controls the engine in a normal mode. This operation result is defined as a control amount for the actuator. When the main signal input system becomes abnormal and the MPU 3 controls the engine in a fail-safe mode, the actuator control amount computation function performs an operation "V2×constant C+constant D" for a voltage V2 inputted from the sub signal input system. This operation result is defined as the control amount. That is, in the normal mode, the processing of a path indicated by the dotted line in FIG. 2 is performed. In the fail-safe mode, the processing of a path indicated by the alternate long and short dash line in FIG. 2 is performed.

In the ECU 1, to run a test for verifying the functions of the MPU 3, the MPU 3 includes a verification result check and test selection unit (section or function) 3a and a test result management unit (section or function) 3b, and the monitor IC 5 includes a test result verification unit (section or function) 5a. Furthermore, the MPU 3 and the monitor IC 5 communicate at a specific period interval (e.g., every 8 ms). The verification result check and test selection unit 3a of the MPU 3 refers to information from the monitor IC 5 to select a test to be run this time, and specifically selects the test ID of a test to be run. The test ID is identification information of the test.

The MPU 3 performs tests of contents corresponding to test IDs selected in the verification result check and test selection unit 3a for each of plural control functions #1, #2, and so forth. The test result management unit 3b of the MPU 3 generates a test result indicating the result of running a test, and transmits the test result and the test ID to the monitor IC 5. The test ID transmitted to the monitor IC 5 by the test result management unit 3b is the test ID of the test run this time in the MPU 3. The respective functions of the verification result check and test selection unit 3a and the test result management unit 3b of the MPU 3 are achieved by the MPU 3 executing programs in the ROM.

On the other hand, the test result verification unit 5a of the monitor IC 5 checks the correctness of the test result transmitted from the MPU 3, and transmits a right or error determination result (a test result verification result or simply as a verification result) to the MPU 3 along with the test ID of the test corresponding to it. The test ID transmitted to the MPU 3 by the test result verification unit 5a is the test ID transmitted along with the test result from the MPU 3. The test result verification unit 5a counts up an error count ECic2 (value of an error counter) each time it determines that a test result from the MPU 3 is "error," and transmits the error count ECic2 to the MPU 3 along with the test result verification result and the test ID.

The verification result check and the test selection unit 3a of the MPU 3 refers to the test result verification result, the test ID, and the error count ECic2 from the monitor IC 5 to select the test ID of the test to be run this time. Therefore, signals flow in the order of <1>, <2>, <3>, and <4> in FIG. 1. Furthermore, the test result verification unit 5a of the monitor IC 5 stores the test ID transmitted from the MPU 3, and at the same time, each time a specific period The elapses, checks whether the test IDs of all types have been transmitted from the MPU 3 for the duration of the elapsed specific period (whether tests of all types have been run). If the test IDs of all types have not been transmitted, it determines that the MPU 3 is abnormal. The test result verification unit 5a, when having performed determination by the above all test run verification function, transmits a history verification result being a determination result of the all test run verification function to the MPU 3 along with the test result verification result, the test ID, and the error count ECic2.

The verification result check and test selection unit 3a of the MPU 3 executes its processing as shown in FIGS. 3 to 7.

Figure 3:
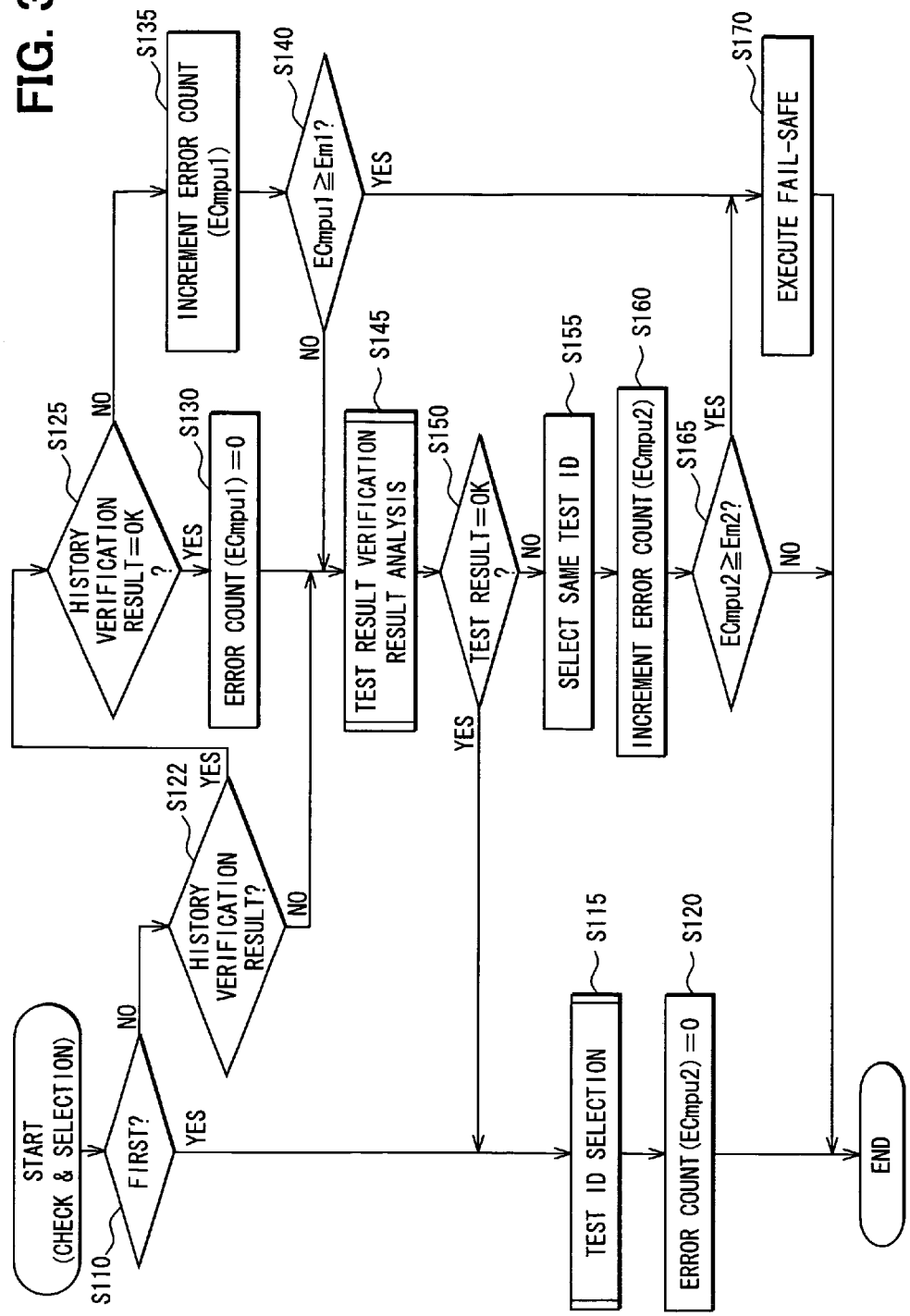
FIG. 3 is a flowchart showing processing of a verification result check and test selection unit in the MPU of the first embodiment.

When electric power is applied to the ECU 1, the MPU 3 performs processing of the verification result check and test selection unit 3a shown in FIG. 3 every specific period (8 ms) which is a communication interval with the monitor IC 5. When the ECU 1 has been activated, each counter described later and the value of test ID in the MPU 3 are initialized to zero, and a flag described later is initialized to OFF.

As shown in FIG. 3, in the processing of the verification result check and test selection unit 3a, in S110, it checks whether the processing is the first execution immediately after activation. If so (S110:YES), it proceeds to S115 to execute test ID selection processing of FIG. 4. In this embodiment, there are one to five test IDs to be used. The test ID selection processing selects the test ID of a test to be run from among 1 to 5; its detailed contents will be described later.

On termination of the test ID selection processing in S115, the verification result check and test selection unit 3a proceeds to S120 to initialize the error count ECmpu2 to zero, and then the processing of the verification result check and test selection unit 3a terminates. On the other hand, in S110, on determining that the processing is not the first execution immediately after activation (second time or later), it proceeds to S122 to check whether it has received the history verification result, along with the test result verification result, the test ID, and the error count ECic2 from the previous execution until this execution. If it does not receive the history verification result, it proceeds to S145; if it receives a history verification result, it proceeds to S125.

In S125, it checks whether the history verification result from the monitor IC 5 is "OK" indicating "normal," and, if so, proceeds to S130 to initialize the error count ECmpu1 to zero, and then proceeds to S145. If it is determined in S125 that the history verification result from the monitor IC 5 is not "OK," it proceeds to increment the error count ECmpu1, and in the next S140, checks whether the error count ECmpu1 has become equal to or greater than a prescribed reference value R1 for determining error determination. Otherwise, it proceeds to S145.

Figure 7:
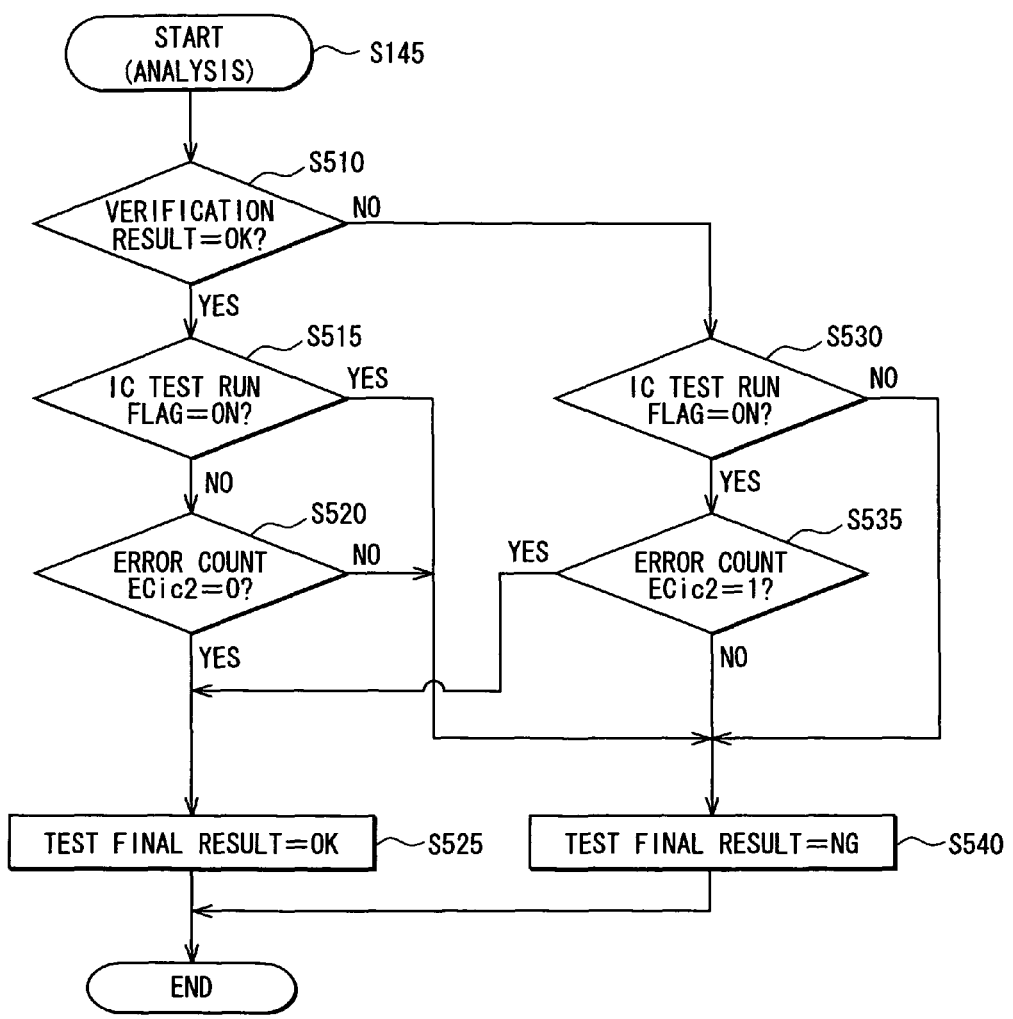
FIG. 7 is a flowchart showing processing of analyzing test result verification results in FIG. 3.

In S145, it performs analysis of test result verification results shown in FIG. 7, and then proceeds to S150. The analysis of test result verification results, which will be detailed later, analyzes the test result verification result received from the monitor IC 5 and the error count ECic2 to determine final test results, which are the overall inspection results that includes the MPU 3 and the monitor IC 5.

Figure 4:
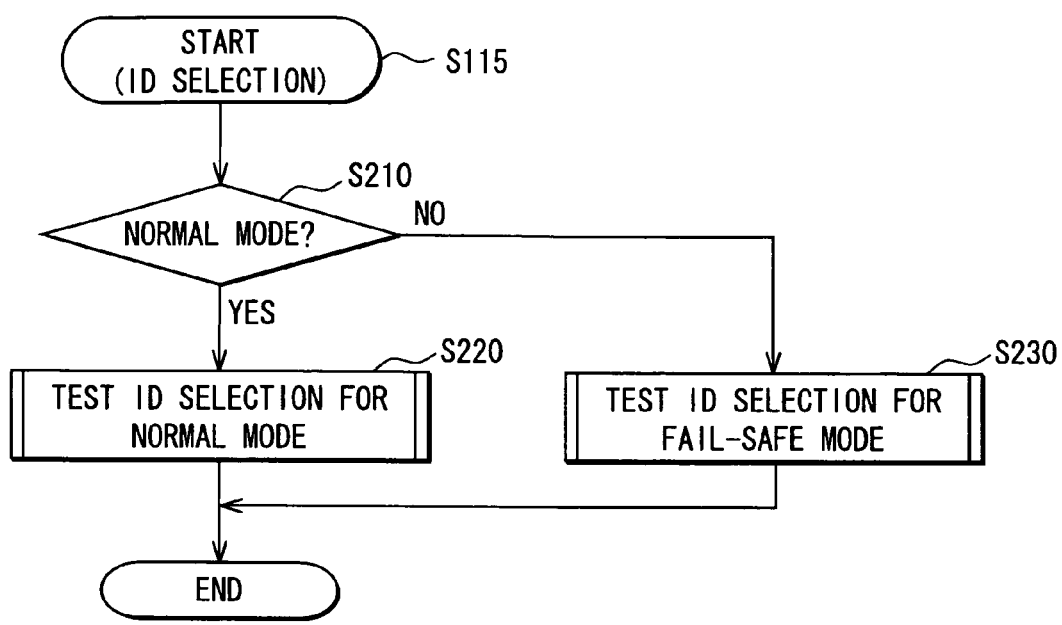
FIG. 4 is a flowchart showing test ID selection processing in FIG. 3.

In S150, it checks whether the final test result determined this time in S145 is "OK" indicating "normal." If so, it proceeds to S115. Therefore, also in this case, the test ID selection processing of FIG. 4 is performed, and the error count ECmpu2 is initialized to zero. If the final test result is not "OK" (S150: NO), it proceeds to S155 to select the same test ID as selected previously as the test ID of the test to be currently run. Specifically, it sets the test ID sent from the monitor IC 5 along with the test result verification result as the test ID of the test to be currently run. By the processing of S155, the same test as the last test is run again. In the next S160, it increments the error count ECmpu2, and in S165, checks whether the error count ECmpu2 has become equal to or greater than a prescribed value Em2 for determining error determination. Otherwise, the processing of the verification result check and test selection unit 3a terminates.

On determining in S140 that the error count ECmpu1 has become equal to or greater than the prescribed value Em1, or on determining in S165 that the error count ECmpu2 has become equal to or greater than the prescribed value Em2, it proceeds to S170 to execute predetermined fail-safe processing. Then the processing of the verification result check and test selection unit 3a terminates.

Since control proceeds to S170 because some error may occur in the MPU 3 or the monitor IC 5, conceivable fail-safe processing performed in S170 is, for example, to reduce throttle opening to decrease the output of the engine. The prescribed values Em1 and Em2 for error determination used in the respective determinations of S140 and S165 may be the same value or different values.

Next, as shown in FIG. 4, when the test ID selection processing is started in S115 of FIG. 3, S210 checks whether a current control mode is a normal mode. If so, S220 executes test ID selection processing for a normal mode shown in FIG. 5. If a current control mode is not a normal mode but a fail-safe mode (S210: NO), control proceeds to S230 to execute test ID selection processing for the fail-safe mode shown in FIG. 6. When the processing of S220 or S230 terminates, the test ID selection processing in S115 in the FIG. 3 terminates.

Figure 5:
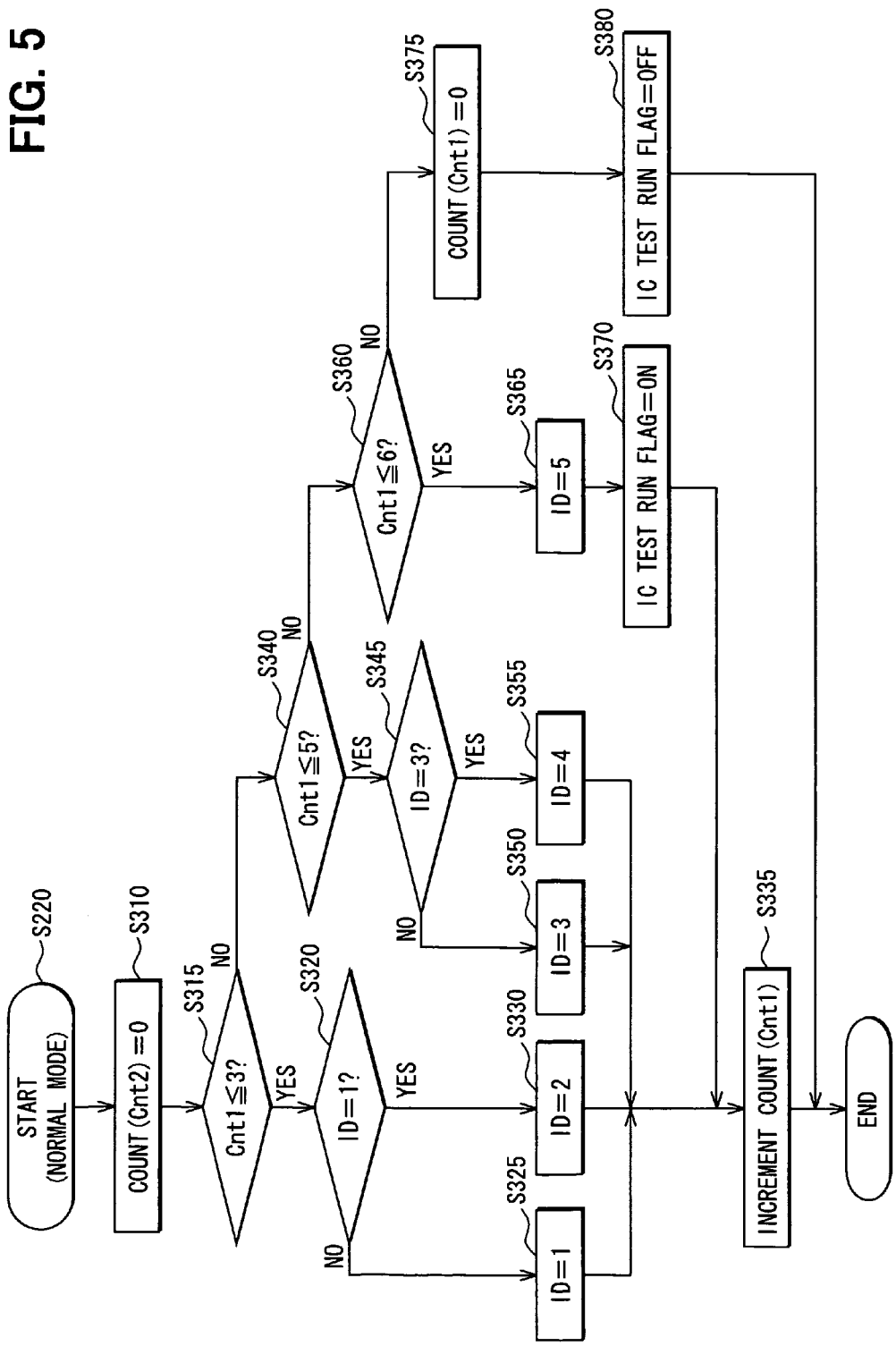
FIG. 5 is a flowchart showing test ID selection processing for normal mode in FIG. 4.

As shown in FIG. 5, in the test ID selection processing for normal mode executed in S220 of FIG. 4, S310 initializes a second count (the value of a second counter) Cnt2 used by the test ID selection processing for fail-safe mode described later to zero. S315 checks whether the first count Cnt1 is three or less, and if so, control proceeds to S320. S320 checks whether the current test ID is one, and otherwise, control proceeds to S325 to set the current test ID to one. Then, control proceeds to increment the first count Cnt1, and then the test ID selection processing for normal mode terminates. When S320 determines that the current test ID is one, control proceeds to S330 to set the current test ID to two, and then proceeds to S335.

On the other hand, when S315 determines that the first count Cnt1 is not three or less, control proceeds to S340 to check whether the first count Cnt1 is five or less, and if so, proceeds to S345. S345 checks whether the current test ID is three, and otherwise, control proceeds to S350 to set the current test ID to three, and then proceeds to S335. When S345 determines the current test ID is three, control proceeds to S355 to set the current test ID to four, and then proceeds to S335.

On the other hand, when S340 determines that the first count Cnt1 is not five or less, control proceeds to S360 to check whether the first count Cnt1 is six or less, and if so, proceeds to S365. S365 sets the current test ID to five, and S370 turns on an IC test run flag before proceeding to S335. The IC test run flag is a flag indicating an IC test period during which a test result (test result for verifying NG determination described later) to be determined intentionally as "error" is transmitted to the monitor IC 5, and a test result verification result for it from the monitor IC 5 is verified to be "error." When the test ID is set to five, and the IC test run flag is turned on, by processing (FIG. 8) of the test result management unit 3b described later, the test result to be determined intentionally as "error" is transmitted to the monitor IC 5. Accordingly, when the IC test run flag is ON, it is normal that a test result verification result from the monitor IC 5 to the MPU 3 is "NG" indicating "error." When S360 determines that the first count Cnt1 is not six or less, control proceeds to S375 to return the first count Cnt1 to zero. S380 turns off the IC test run flag, and then the test ID selection processing for normal mode terminates.

Figure 13:
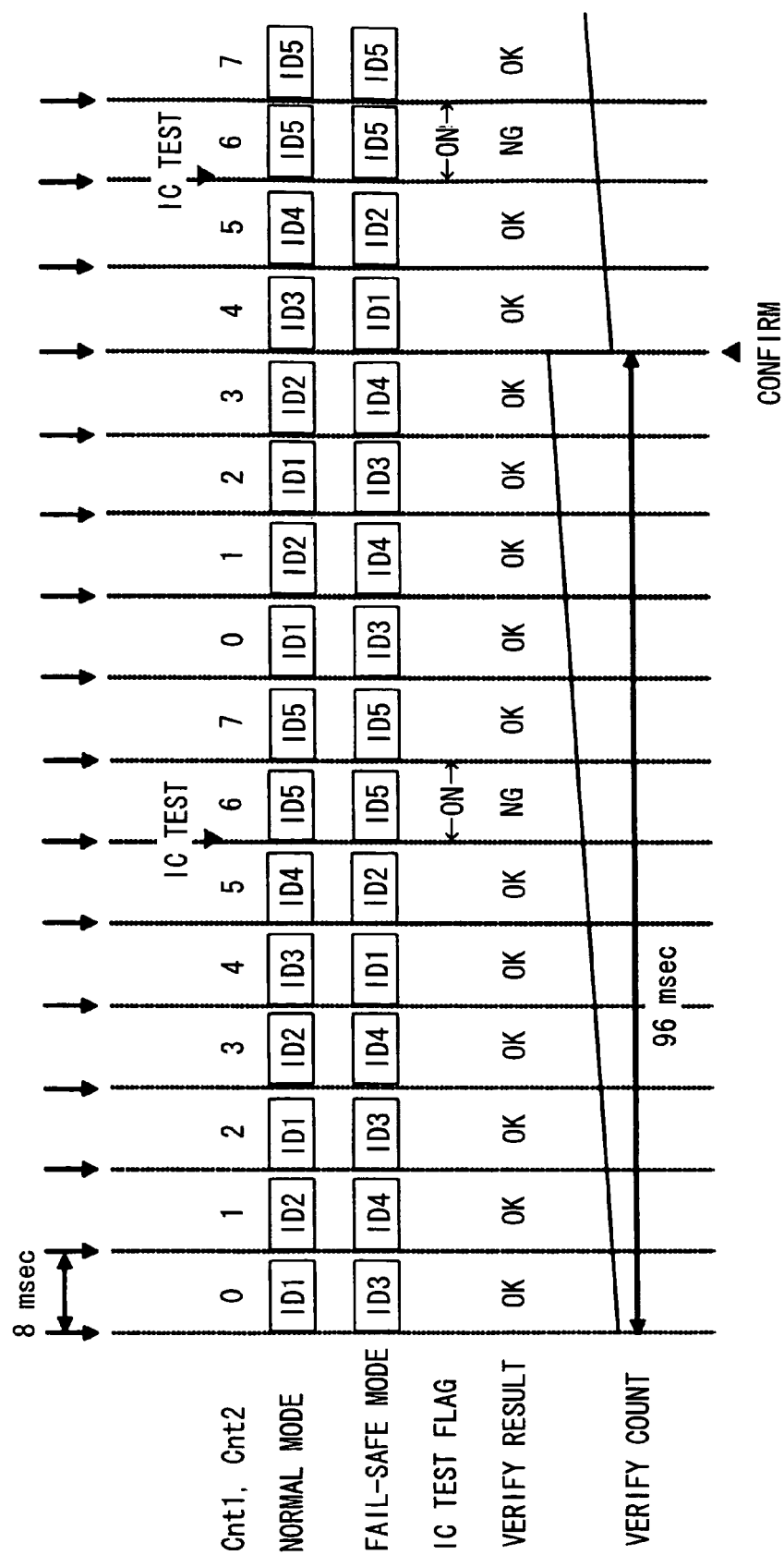
FIG. 13 is a first time chart showing the operation of the ECU of the first embodiment.

In the test ID selection processing for normal mode, as shown in FIG. 13, the first count Cnt1 laps around between zero and seven.

When the first count Cnt1 is zero to three, the test ID is alternately set between 1 and 2 (S315 to S330). When the first count Cnt1 is four, the test ID is set to three. When the first count Cnt1 is five, the test ID is set to four (S340 to S355). When the first count Cnt1 is six, the test ID is set to five, and the IC test run flag is turned on (S360 to S370). When the first count Cnt1 is seven, with the test ID set to five, the IC test run flag is turned off (S380). Test IDs of one and two (ID=1, 2) indicate tests of logics (processing executed during the normal mode) used during normal mode. Test IDs of 3 and 4 indicate tests of logics (processing executed during the fail-safe mode) used during fail-safe mode. In the test ID selection processing for normal mode, ID=1, 2 is selected more frequently than ID=3, 4. Test ID of 5 (ID=5) indicates a test of the monitor IC 5.

Figure 6:
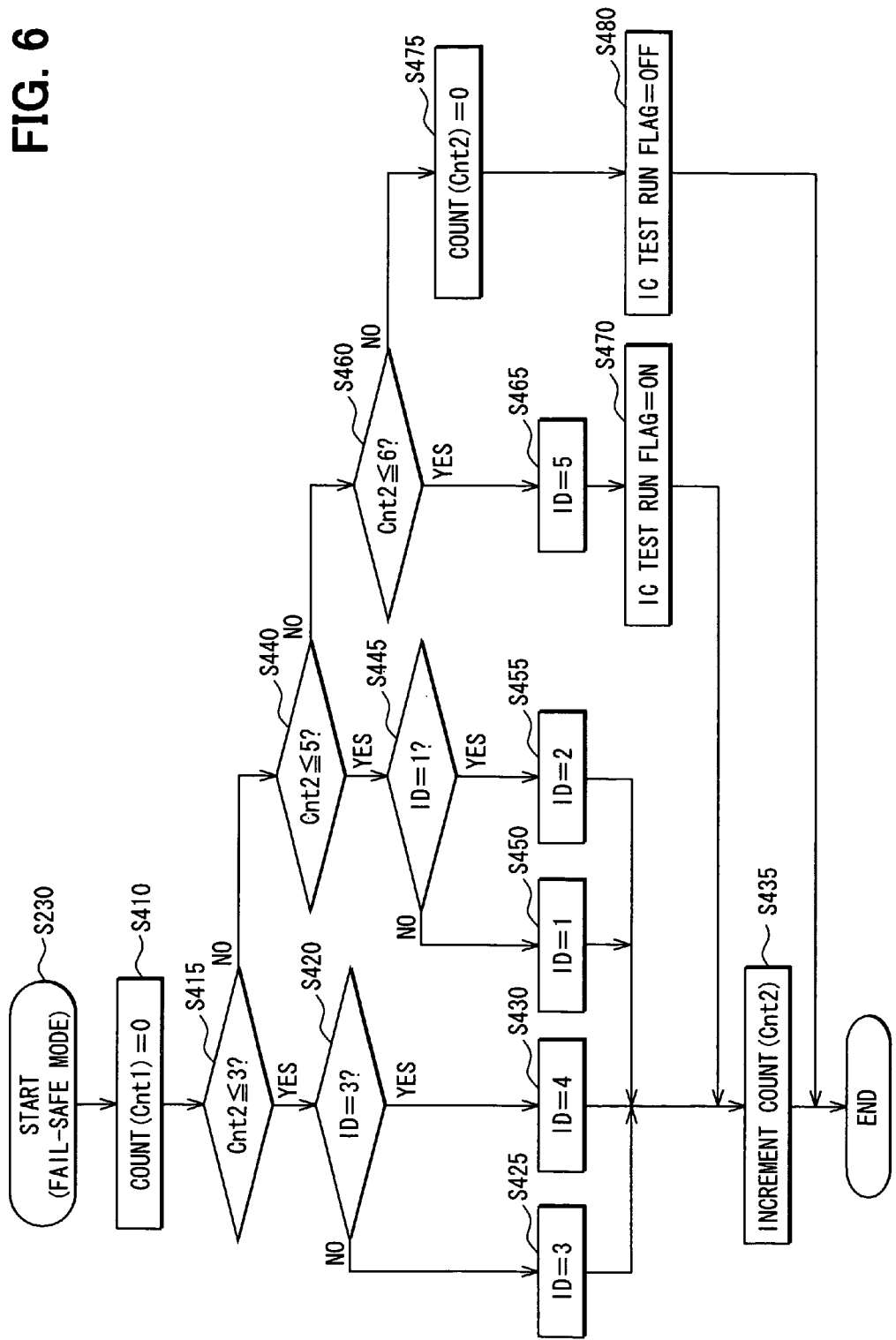
FIG. 6 is a flowchart showing test ID selection processing for fail-safe mode in FIG. 4.

Next, as shown in FIG. 6, in the test ID selection processing for fail-safe mode executed in S230 of FIG. 4, S310 initializes the first count Cnt1 used in the test ID selection processing for the normal mode described previously to zero. The next S415 checks whether the second count Cnt2 is three or less, and if so, control proceeds to S420. S420 checks whether the current test ID is three, and otherwise, control proceeds to S425 to set the current test ID to three. Control proceeds to S435 to increment the second count Cnt2, and then the test ID selection processing for fail-safe mode terminates. When S420 determines that the current test ID is three, control proceeds to S430 to set the current test ID to four, and then proceeds to S435.

On the other hand, when S415 determines that the second count Cnt2 is not three or less, control proceeds to S440 to check whether the second count Cnt2 is five or less, and if so, proceeds to S445. S445 checks whether the current test ID is one, and otherwise, control proceeds to S450 to set the current test ID to one, and then proceeds to S435. When S445 determines that the current test ID is one, control proceeds to S455 to set the current test ID to two, and then proceeds to S435.

On the other hand, when S440 determines that the second count Cnt2 is not five or less, control proceeds to S460 to check whether the second count Cnt2 is six or less. If so, control proceeds to S465 and sets the current test ID to five, S470 turns on IC test run flag, and then control proceeds to S435. When S460 determines that the second count Cnt2 is not six or less, control proceeds to S475 t6 return the second count Cnt2 to zero. S480 turns off the IC test run flag, and then the test ID selection processing for fail-safe mode terminates.

In the test ID selection processing for fail-safe mode, as shown in FIG. 13, the second count Cnt2 laps around between zero and seven. When the second count Cnt2 is zero to three, the test ID is alternately set to three and four (S415 to S430). When the second count Cnt2 is four, the test ID is set to one. When the second count Cnt2 is five, the test ID is set to two (S440 to S455). When the second count Cnt2 is six, the test ID is set to five and the IC test run flag is turned on (S460 to S470). When the second count Cnt2 is seven, with the test ID set to five, the IC test run flag is turned off (S480). Therefore, in the test ID selection processing for fail-safe mode, contrary to the test ID selection processing for normal mode, ID=3, 4 is selected more frequently than ID=1, 2.

Next, as shown in FIG. 7, in the analysis of test result verification results executed in S145 of FIG. 3, S510 checks whether the test result verification result received from the monitor IC 5 is "OK" indicating "normal." If so, control proceeds to S515 to check whether the IC test run flag is ON. Otherwise, control proceeds to S520 to check whether the error count ECic2 received from the monitor IC 5 is zero. If so, control proceeds to S525. S525 sets final test results being the overall inspection results that include the MPU 3 and the monitor IC 5 to "OK" indicating "normal," and then the analysis of test result verification results terminates.

When S510 determines that the test result verification result received from the monitor IC 5 is not "OK," control proceeds to S530 to check whether the IC test run flag is ON. If so, control proceeds to S535 to check whether the error count ECic2 received from the monitor IC 5 is one. If so, control proceeds to S525. Therefore, also in this case, a final test result is set to "OK." On the other hand, when S530 determines that the IC test run flag is not ON, this means that although the test result to be determined intentionally as "error" is not transmitted to the monitor IC 5, the test result verification result from the monitor IC 5 is not "OK" (that is, "NG"). Since the test result transmitted from MPU 3 to the monitor IC 5 is considered to be really an error, control proceeds to S540 to set the final test result to "NG" indicating "error." Then, the analysis of test result verification results terminates.

When S535 determines that the error count ECic2 is not one, it is determined that a count-up function (processing of S745 of FIG. 10 described later) of the error count ECic2 in the monitor IC 5 malfunctions, control proceeds to S540 to set the final test result to "NG."

When S515 determines that the IC test-execution flag is ON, this means that although the test result to be determined intentionally as "error" is transmitted to the monitor IC 5, the test result verification result from the monitor IC 5 is "OK." Therefore, it is determined that the function (test result verification unit 5a) of the monitor IC 5 to determine a test result malfunction, and control proceeds to S540 to set the final test result to "NG." When S520 determines that the error count ECic2 is not zero, it is determined that the function (processing of FIG. 10 described later) to reset the error count ECic2 in the monitor IC 5 malfunctions, and control proceeds to S540 to set the final test result to "NG." The final test result set to "OK" or "NG" in S525 or S540 of FIG. 7 is referred to in S150 of FIG. 3.

The MPU 3, when the processing of FIG. 3 terminates, runs a test of contents corresponding to a test ID selected in S115 or S155 at that time for each of plural control functions #1, #2, and so forth. The following describes the contents of tests run in the MPU 3.

The MPU 3 is put in the normal mode when the main of the main and sub signal input systems described previously, and in the fail-safe mode when the main signal input system is abnormal. In this embodiment, there are sixteen control functions #1 to #16 to be tested. Each of these control functions #1 to #16 performs during the normal mode, as shown in FIG. 2, a predetermined operation on the voltage V1 inputted from the main signal input system to obtain the control amount and the like of the actuator corresponding to the control function. During the fail-safe mode, it performs a predetermined operation on the voltage V2 inputted from the sub-signal input system to obtain the control amount and the like of the actuator corresponding to the control function.

In the test of test ID=1, for a path (processing path) during normal mode in the control functions #1 to #16, a first dummy input value is afforded, and the result of an operation on the dummy input value is determined as a test result. In the test of test ID=2, for a path during normal mode in the control functions #1 to #16, a second dummy input value different from the first dummy input value is afforded, and the result of an operation on the input value is determined as a test result. On the other hand, in the test of test ID=3, for a path during fail-safe mode in the control functions #1 to #16, a third dummy input value is afforded, and the result of an operation on the input value is determined as a test result. In the test of test ID=4, for a path during fail-safe mode in the control functions #1 to #16, a fourth dummy input value different from the third dummy input value is afforded, and the result of an operation on the input value is determined as a test result.

The first dummy input value may be a different value for each of the control functions #1 to #16. The same is also true for the second to fourth dummy input values. For test ID=5, tests of the control functions #1 to #16 are not run. By processing FIG. 8 described later, the test replies for IC test (test replies for verifying NG determination for verifying the functions of the monitor IC 5 and the test replies for verifying OK determination) are only created.

The test ID is set to any of one to four in the processing of FIG. 3, and the MPU 3 runs a test having contents corresponding to the test ID for each of the control functions #1 to #16. Alternatively, when the test ID is set to five in the processing of FIG. 3, the processing of the test result management unit 3b is run as shown in FIG. 8.

Figure 8:
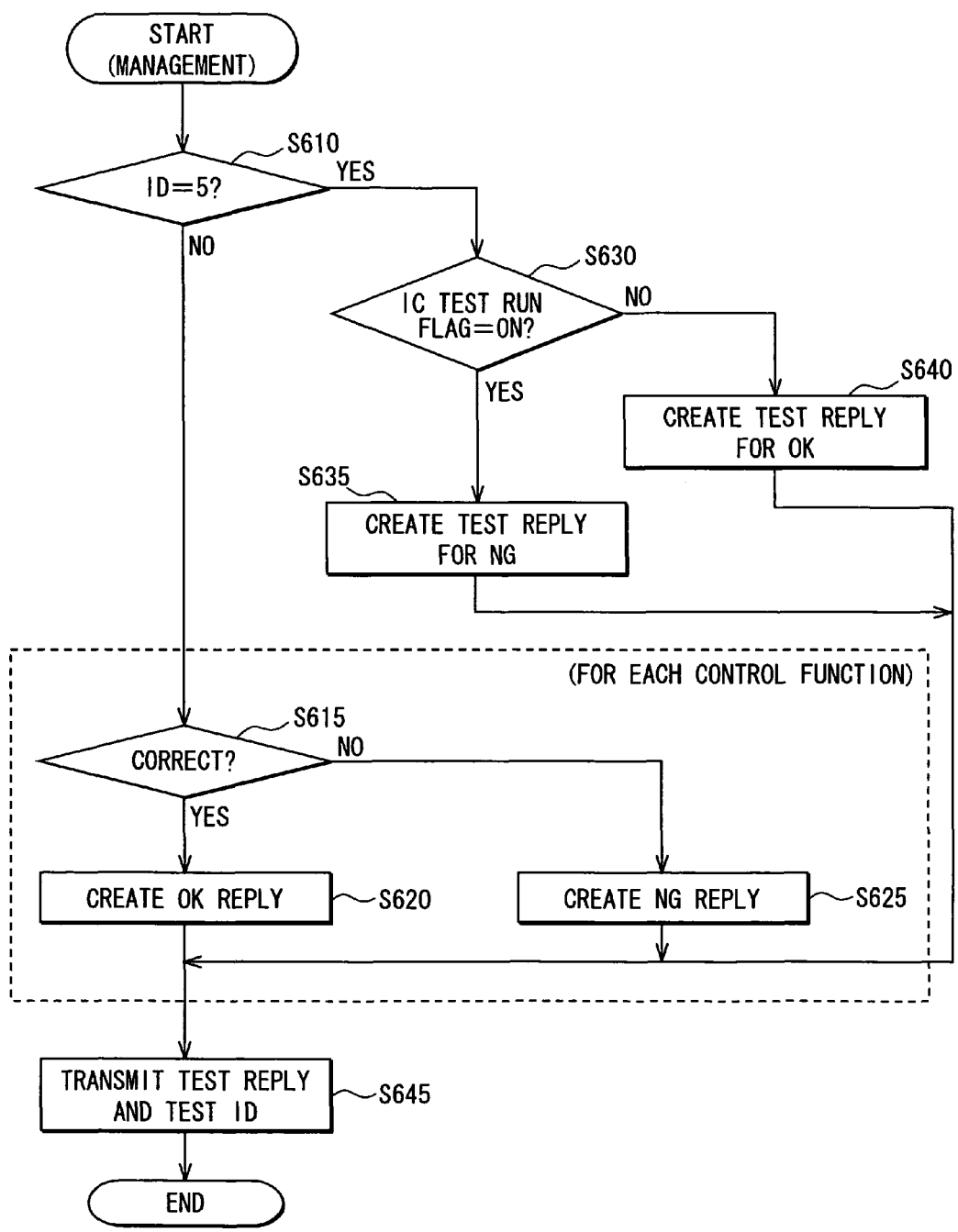
FIG. 8 is a flowchart indicating processing of a test result management unit in the MPU of the first embodiment.

As shown in FIG. 8, in the processing of the test result management unit 3b, S610 checks whether the current test ID is five, and otherwise (that is, any one of one to four), control proceeds to S615. S615 checks whether the result of the test run this time for each of the control functions #1 to #16 is correct. Specifically, in the MPU 3, for each of the control functions #1 to #16, a correct operation result when the first dummy input value described previously is afforded to a path during normal mode in the control function is stored as the expected value for the normal mode test. Moreover, in the MPU 3, for each of the control functions #1 to #16, a correct operation result when the third dummy input value described previously is afforded to a path during the fail-safe mode in the control function is stored as an expected value for fail-safe mode test.

If the current test ID is one or two, S615 compares the test result with the expected value for normal mode test for each of the control functions #1 to #16. If the compared two match, it determines that the test result is correct. Moreover, if the current test ID is three or four, S615 compares the test result with the expected value for fail-safe mode test for each of the control functions #1 to #16. if the compared two match, it determines that the test result is correct.

Therefore, when the test ID is one or three, if the test of a certain control function and the determination of S615 are normally performed, S615 determines that "Test result is correct." When the test ID is two or four, if the test of a certain control function and the determination of S615 are normally performed, S615 determines that "Test result is not correct." Tests of ID=1,3 are tests (tests expected as OK) expected that it is determined in S615 that "Test result is correct." Tests of ID-2 and 4 are tests (tests expected as NG) expected that it is determined in S615 that "Test result is not correct." Thus, the reason that not only tests expected as OK but also tests expected as NG are provided is to enable verification that determination in S615 is not adhered to any of "YES" and "NO."

For such a control function that it is determined in S615 that test result is correct, S620 creates a test replay indicating "OK" as a test result. For such a control function that it is determined in S615 that test result is not correct, S625 creates a test replay indicating "NG" as a test result.

Specifically, the test result is created according to rules shown in FIG. 9A. That is, when the test ID is one or two, if S615 determines that the test result of a certain control function #n (n is any of 1 to 16) is correct, of numeric values described in a column of "ID=1" in FIG. 9A, a numeric value corresponding to "#n" is designated as a test result indicating "OK" for the control function #n. When the test ID is one or two, if S615 determines that the test result of a certain control function #n is not correct, of numeric values described in a column of "ID=2" in FIG. 9A, a numeric value corresponding to "#n" is designated as a test result indicating "NG" for the control function #n.

Therefore, for example, when the test ID is one or two, if S615 determines that the test result of a control function #1 is correct, {01} is a test result indicating "OK" for the control function #1. When the test ID is one or two, if S615 determines that the test result of a control function #1 is not correct, {11} is a test result indicating "NG" for the control function #1. Numeric values described in FIG. 9 and numeric values within { } are represented in hexadecimal.

Likewise, when the test ID is three or four, if S615 determines that a test result of a certain control function #n is correct, of numeric values described in a column of "ID=3" in FIG. 9A, a numeric value corresponding to "#n" is designated as a test result indicating "OK" for the control function #n. When the test ID is three or four, if S615 determines that the test result of a certain control function #n is not correct, of numeric values described in a column of "ID=4" in FIG. 9A, the numeric value corresponding to "#n" is designated as a test result indicating "NG" for the control function #n.

Therefore, for example, when the test ID is three or four, if S615 determines that a test result of a control function #1 is correct, {21} is a test result indicating "OK" for the control function #1. when the test ID is three or four, if S615 determines that the test result of a control function #1 is not correct, {31} is a test result indicating "NG" for the control function #1.

As described above, since tests of test ID=2, 4 are tests expected as NG that are to be determined in S615 as "Test result is not correct," if the MPU 3 is normal, when the test ID is m (m is any of one to four), numeric values described in a column of "ID=m" in FIG. 9A are test replies for control functions #1 to #16.

When S610 determines that the current test ID is five, control proceeds to S630 to check whether the IC test run flag is ON. If so (S630: YES), control proceeds to S635 to create a test result for verifying NG determination to be determined as "error" in the monitor IC 5 as the test result for the control functions #1 to #16. If the IC test run flag is OFF, (S630: NO), control proceeds to S640 to create a test result for verifying OK determination to be determined as "correct" in the monitor IC 5 as the test result for control functions #1 to #16.

Specifically, the test result is created according to rules shown in FIG. 9B. That is, S635 designates a numeric value corresponding to "#n" of numeric values described in the left column of FIG. 9B as a test result for a control function #n. S640 designates a numeric value corresponding to "#n" of numeric values described in a right column of FIG. 9B as a test result for a control function #n. Therefore, when the test ID is five, and the IC test run flag is ON, test replies of the control functions #1 to #16 all are "FF." When the test ID is five, and the IC test run flag is off, for example, the test result of control function #1 is {41}, and the test result of control function #2 is {42}. When the test result is created for each control function #1 to #16 by the above processing of S610 to S640, S645 transmits a test result for the each control function #1 to #16 and the current test ID (that is, the test ID of the test selected and run this time in the MPU 3) to the monitor IC 5, and the processing of the test result management unit 3b terminates.

Figure 10:
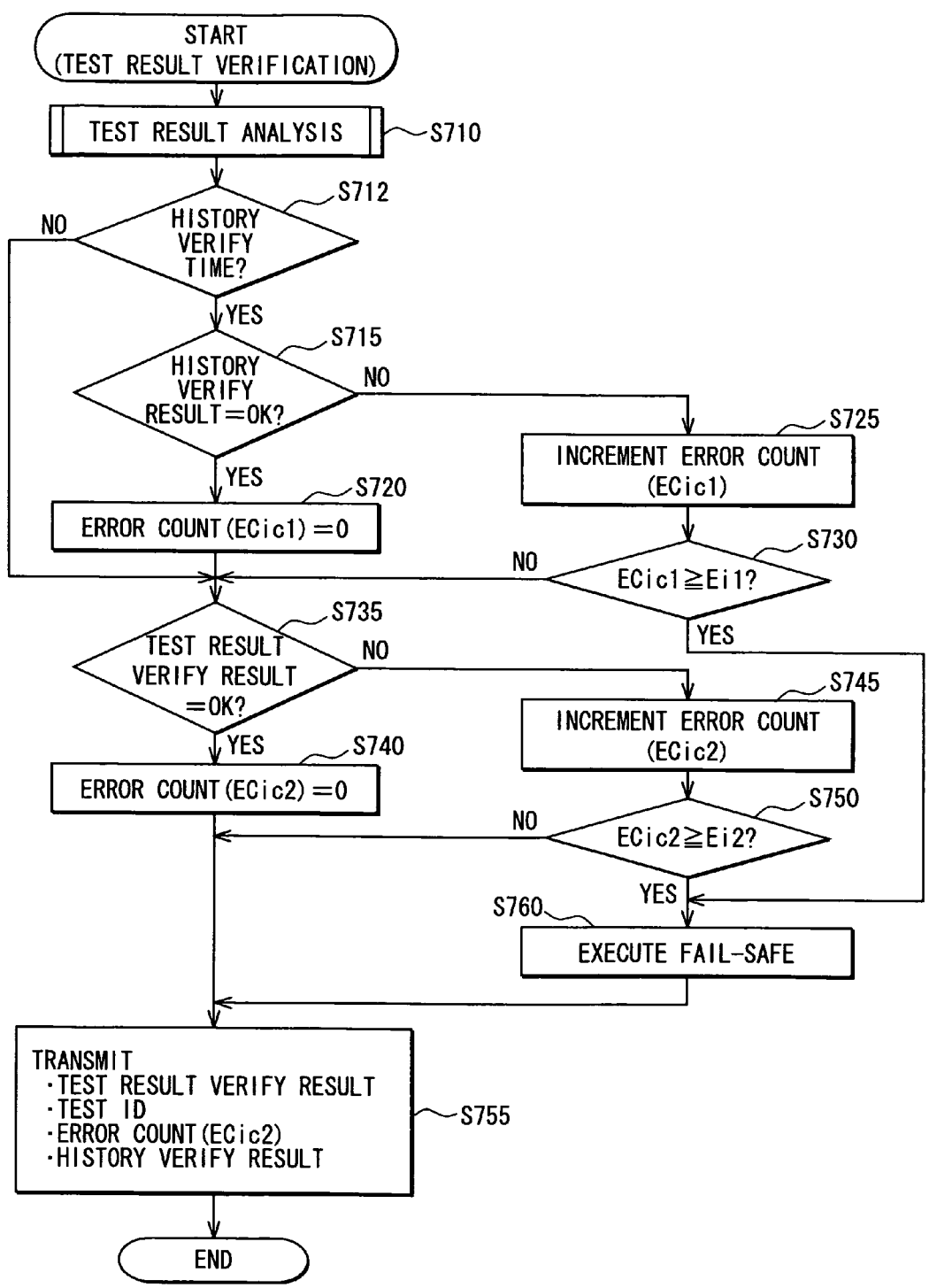
FIG. 10 is a flowchart showing processing performed by a test result verification unit of a monitor IC.
Figure 11:
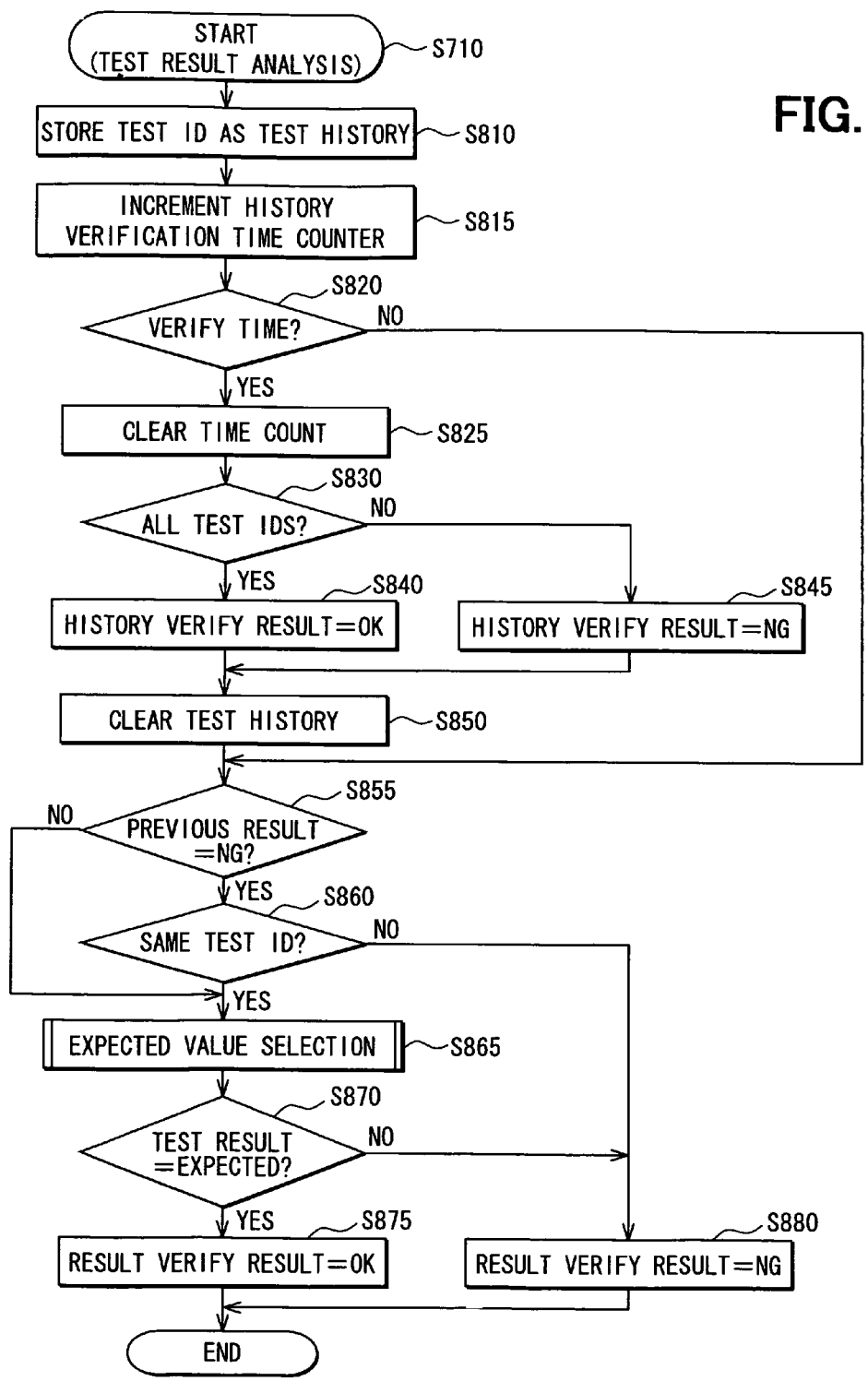
FIG. 11 is a flowchart showing test result analysis processing in FIG. 10.

The test result verification unit 5a in the monitor IC 5 executes the contents of processing shown in FIGS. 10 and 11. Each time the test result verification unit 5a of the monitor IC 5 receives the test result and the test ID transmitted from the MPU 3, it starts the processing of FIG. 10. The value of each counter in the monitor IC 5 is initialized to zero when the ECU 1 is started. S710 performs test result analysis processing shown in FIG. 11.

As shown in FIG. 11, in the test result analysis processing S710, S810 stores the test ID received this time from the MPU 3 as a test history in the history storage area in a memory provided in the monitor IC 5. S815 increments a history verification time count. Next, S820 checks whether history verification time arrives at an interval of the specific period Thc described previously by determining whether the history verification time count reaches a threshold value corresponding to the specific period Thc. On determining that the history verification time count does not reach the threshold value, and the history verification time does not arrive (S820: NO), control proceeds to S855. On determining that the history verification time has arrived (S820: YES), control proceeds to S825. S825 clears the history verification time count to zero, and S830 checks whether the test IDs of all types from one to five are stored as the test history in the history storage area (that is, whether test IDs of all types have been transmitted this time for the duration of the elapsed specific period Thc, i.e., whether tests of all types have been run).

If there are test IDs of all types in the history storage area (S830: YES), S840 sets a history verification result to "OK" indicating "normal," and S850 clears the test history (test ID) within the history storage area, and then proceeds to S855. If there are not test IDs of all types in the history storage area (S830: NO), S845 sets the history verification result to "NG" indicating "error," and S850 clears the test history (test ID) within the history storage area, and then proceeds to S855.

By the above-described processing of S810 to S850, the above all test run verification function has been achieved. In this embodiment, the specific interval Thc being an arrival interval of history verification time is, for example, 96 ms as shown in FIG. 13.

S855 checks whether the test result verification result transmitted previously to the MPU 3 is "NG" corresponding to "error." If the previous test result verification result is not "NG," (S855: NO), control proceeds to S865. Otherwise (S855: YES), control proceeds to S860. S860 checks whether the test ID received this time from MPU 3 is the same as the test ID received previously, and if so, control proceeds to S865. S865 selects an expected value for determining correctness or incorrectness. The expected value for determining correctness or incorrectness is for checking whether the test result received from the MPU 3 is correct. Specifically, the monitor IC 5, as shown in FIG. 12, stores the above rules stored in the MPU 3 that are exactly the same as those in the right side of FIGS. 9A and 9B. S865, when the test ID received this time from the MPU 3 is M (M is any of one to five), selects a numeric value described in the column of "ID=M" in FIG. 12 as an expected value for determining correctness or incorrectness for the test result for each control function #1 to #16.

Next, control proceeds to S870 to check whether the test result received this time from the MPU 3 matches the expected value for determining correctness or incorrectness selected in S865, for the control functions #1 to #16. For all control functions #1 to #16, if the test result and the expected value for determining correctness or incorrectness match (S870: YES), control proceeds to S875 to set a test result verification result "OK" corresponding to "correct," and then the test result analysis processing terminates. For one or more of the control functions #1 to #16, if the test result and the expected value for determining correctness or incorrectness do not match (S870: NO), control proceeds to S880 to set the test result verification result to "NG" corresponding to "error," and then the test result analysis processing terminates. When S860 determines that the current test ID is not the same as the previous test ID, control proceeds to S880 to set the test result verification result to "NG," and then the test result analysis processing terminates.

Referring back to FIG. 10, when the test result analysis processing terminates in S710, S712 checks whether this time is the history verification time (that is, the S820 checks whether the history verification time has arrived). If this time is not the history verification time, control proceeds immediately to S735. Otherwise, control proceeds to S715.

S715 checks whether the history verification result set in S840 or S845 of the latest test result analysis processing is "OK." If so, control proceeds to S720 to initialize the error count ECic1 to zero, and then proceeds to S735. If S715 determines that the history verification result is not "OK," control proceeds to S725 to increment the error count ECic1. The next S730 checks whether the error count ECic1 has become equal to or greater than a prescribed value Ei1 for error determination. If not so, control proceeds to S735.

S735 checks whether the test result verification result set in S875 or S880 of the latest test result analysis processing is "OK." If so, control proceeds to S740 to initialize the value of error count ECic2 to zero, and then proceeds to S755. If S735 determines that the test result verification result is not "OK," control proceeds to S745 to increment the error count ECic2. The next S750 checks whether the error count ECic2 has become equal to or greater than a prescribed value Ei2 for error determination. Otherwise, control proceeds to S755.

On the other hand, on determining in S730 that the error count ECic1 has become equal to or greater than the prescribed value Ei1, or on determining in S750 that the error count ECic2 has become equal to or greater than the prescribed value Ei2, it proceeds to S760 to execute predetermined fail-safe processing, and then proceeds to S755. Since control proceeds to S760 because some error may occur in the MPU 3, conceivable fail-safe processing performed in S760 is to output a fail-safe signal to reduce the output of the engine in precedence over output from the MPU 3. The prescribed value for determining error determination used in the respective determinations of S730 and S750 may be the same value or different values.

S755 transmits information to the MPU 3. Specifically, if this time is the history verification time at an interval of the specific period Thc, it transmits to the MPU 3 the test result verification result and the history verification result set in the latest test result analysis processing, the error count ECic2, and the test ID received from the MPU 3 along with the test result. If this time is not the history verification time, it transmits to the MPU 3 the test result verification result set in the latest test result analysis processing, the error count ECic2, and the test ID received from the MPU 3 along with the test result. After the processing of S755 is performed, the processing of FIG. 10 terminates.

The following describes the operation of the monitor IC 5 by processing of FIGS. 10 and 11.

If the MPU 3 is normal, as shown in FIG. 13, only when the test ID from the MPU 3 has become five from other than five (that is, when the IC test run flag has been turned on in the MPU 3), the test result verification result becomes "NG" (S880). In other cases, the test result verification result becomes "OK" (S875). When the test ID from the MPU 3 has become five from other than five MPU 3, the test replies for the control functions #1 to #16 transmitted from the MPU 3 to the monitor IC 5 all become {FF}, while expected values for determining correctness or incorrectness used in S870 of FIG. 11 in the monitor IC 5 are {41}, {42}, {43}, ... {50} as shown in the rightmost column of FIG. 12.

When the MPU 3 is normal and the test ID to the monitor IC 5 has become from other than five to five, in the monitor IC 5, since the test result verification result becomes "NG" and the error count ECic2 is counted up by S745 of FIG. 10, "NG" is transmitted as the test result verification result from the monitor IC 5 to the MPU 3, and one is transmitted as the error count ECic2. However, in this case, since the processing of FIG. 7 in the MPU 3 proceeds in the order of S510: NO→S530:YES→S535:YES→S525, the final test result becomes "OK" instead of "NG."

Figure 14:
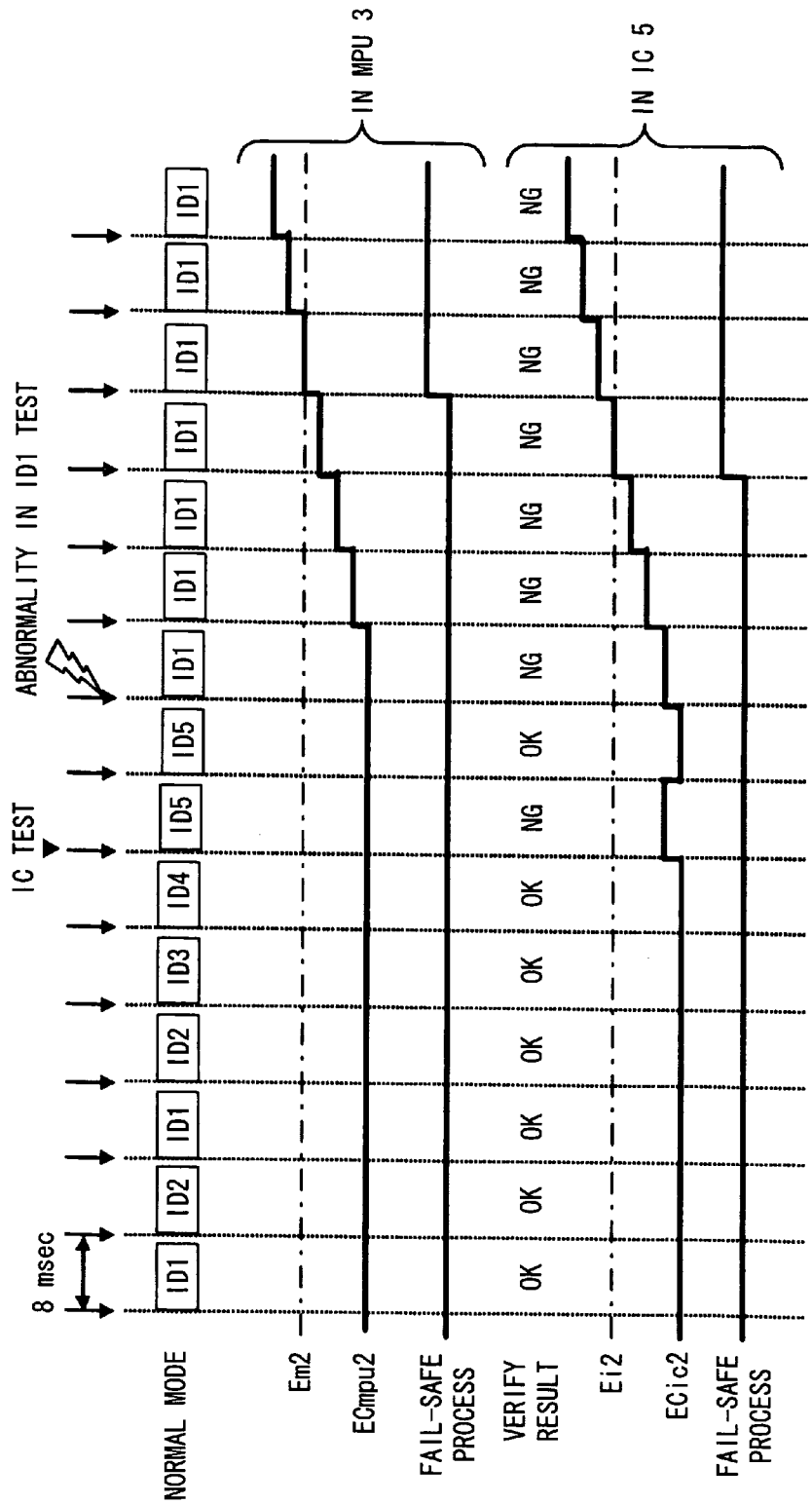
FIG. 14 is a second time chart showing the operation of the ECU of the first embodiment.

On the other hand, when an error occurs in the MPU 3 and, for example, as shown in FIG. 14, it is assumed that the result of running a test of ID=1 becomes a value different from the expected value used for determination in S615 of FIG. 8, the test result from the MPU 3 to the monitor IC 5 is different from numerical values {01}, {02}, ... {10} described in the column of "ID=1" in FIG. 9A. Therefore, the monitor IC 5 determines in S870 of FIG. 11 that the test result from the MPU 3 and the expected value for determining correctness or incorrectness do not match, sets the test result verification result to "NG" (S880), and counts up the error count ECic2 (S745). When the test result verification result from the monitor IC 5 to the MPU 3 becomes "NG," since the IC test run flag is not turned on in the MPU 3, in the processing of FIG. 7, determination is made as S510:NO→S530:NO. The final test result is set to "NG" (S540). The processing of S155 and S160 in FIG. 3 is performed, the test of the same test ID=1 as the last time is run again in the MPU 3, and the same test ID (=1) as the last time is transmitted from the MPU 3 to the monitor IC 5.

As shown in FIG. 14, when the test of ID=1 is not normally run for a long time in the MPU 3, the error count ECic2 is counted up in the monitor IC 5 (S745). When the error count ECic2 reaches the prescribed value EI2, the determination in S750 of FIG. 10 is made as "YES" and the fail-safe processing (S760) is performed. The error count ECmpu2 is counted up also in the MPU 3 (S160). When the error count ECmpu2 reaches the prescribed value Em2, the determination in S165 of FIG. 3 is made as "YES" and the fail-safe processing (S170) is performed.

In the MPU 3, for example, when a test result cannot be normally created in the processing of FIG. 8, in the monitor IC 5, since S870 of FIG. 11 determines that the test result from MPU 3 and the expected value for determining correctness or incorrectness do not match, and error is detected.

Figure 15:
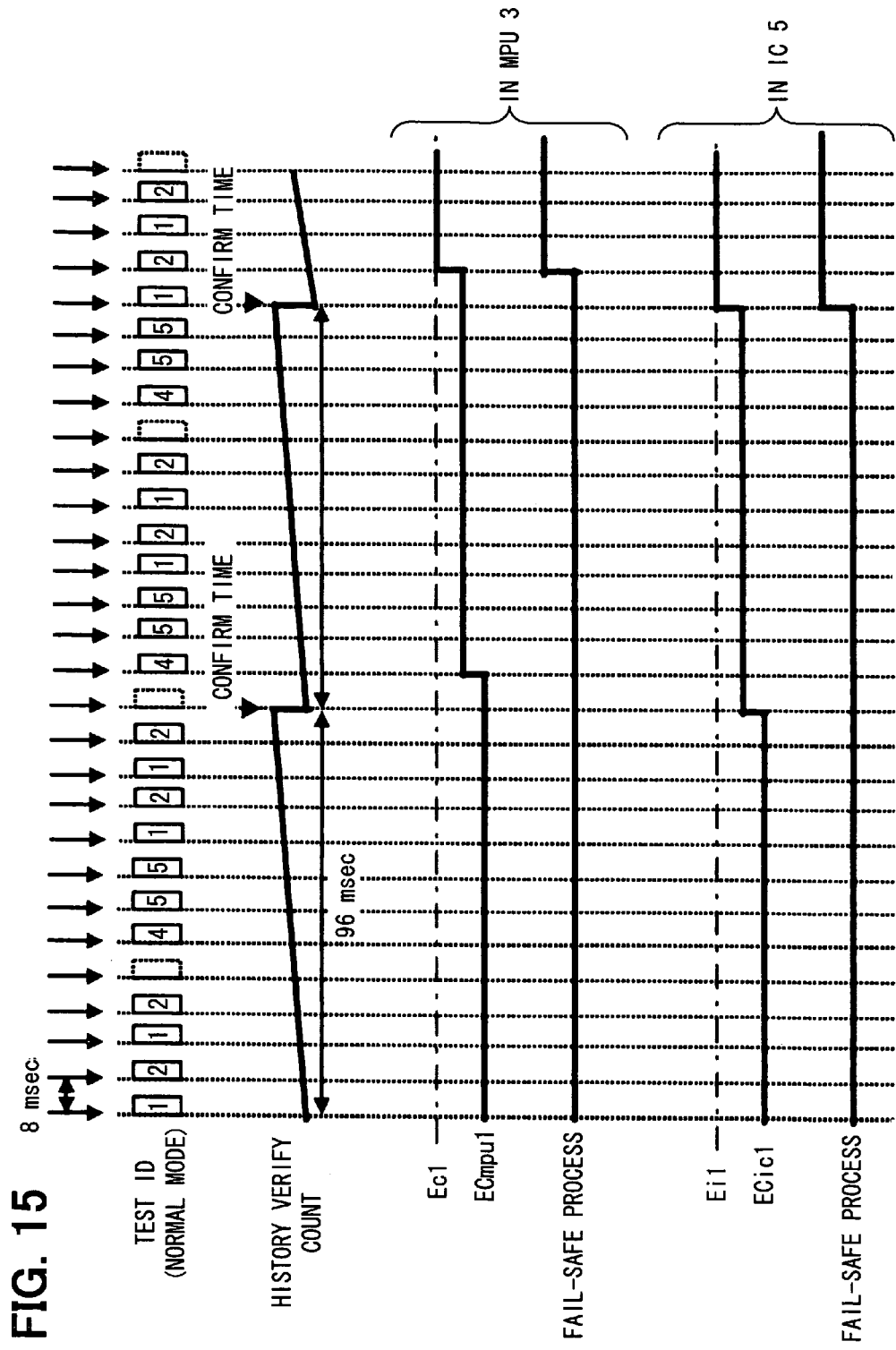
FIG. 15 is a third time chart showing the operation of the ECU of the first embodiment.

As shown in FIG. 15, when, for example, test ID=3 is not selected for the specific period Thc (96 ms) or longer because of an error in the MPU 3, in the monitor IC 5, the history verification result is set to "NG" by the processing of S810-S850 in FIG. 11." At the same time, the error count ECic1 is counted up by the processing S715 and S725 of FIG. 10. When that state lasts and the error count ECic1 reaches the prescribed value Ei1, the determination in S730 of FIG. 10 is made as "YES" and the fail-safe processing (S760) is performed. Furthermore, the history verification result at the interval of the specific period Thc by the monitor IC 5 is transmitted to the MPU 3. When the history verification result becomes "NG," in the MPU 3, the error count ECmpu1 is counted up by the processing of S125 and S135 of FIG. 3. Also in the MPU 3, when the error count ECmpu1 reaches the prescribed value Em1, the determination in S140 of FIG. 3 is made as "YES" and the fail-safe processing (S170) is performed.

Although the test result verification result previously transmitted to the MPU 3 is "NG" (that is, the previous test result from the MPU 3 is determined as "error"), when the same test ID as the previous one is not transmitted from the MPU 3 (S855:YES→S860:NO in FIG. 8), the monitor IC 5 determines that the MPU 3 is abnormal, and sets the test result verification result to "NG." Therefore, the abnormality (that is, abnormality of re-test run function) that the processing of S150 and S155 of FIG. 3 is not normally performed in the MPU 3 can be detected.

When the MPU 3 is normal but the test ID changes from five to other than five, the test result for verifying NG determination to be determined intentionally as "error" is transmitted from the MPU 3 to the monitor IC 5. The test result verification result becomes "NG" in the monitor IC 5. On receiving the test result verification result, since the IC test run flag is ON, the MPU 3 performs processing as S510: NO→S530:YES→S535:YES→S525 in FIG. 7, and the final test result becomes "OK." Therefore, in this case, even if the test result verification result from the monitor IC 5 to the MPU 3 is "NG," the processing of S150 and S155 in FIG. 3 is not performed in the MPU 3. However, in this case, by the processing of FIG. 5 or 6 performed in S115 of FIG. 3, the test ID remains set to five, which is the same as that in the last time. That is, test ID=5 is originally transmitted repeatedly twice from the MPU 3 to the monitor IC 5. Accordingly, when the test ID from the MPU 3 becomes from other than five to five, even if the test result verification result becomes "NG," the next time also receive the same test ID=5 as the last time, so that an incorrect determination is not made as abnormality without the determination in S860 of FIG. 11 being made as "NO."

The ECU 1 includes in the MPU 3 the verification result check and test selection unit 3a that selects a test for function verification. The MPU 3 runs a test selected by the verification result check and test selection unit 3a, and transmits the test result showing the execution result to the monitor IC 5. The monitor IC 5 determines the correctness or incorrectness of the test result from the MPU 3. Therefore, the monitor IC 5 does not need to have a function to select a test, so that the functions of the monitor IC 5 can be simplified. Still, since the MPU 3 itself selects a test, tests suited for control mode are very easily selected. Since the MPU 3 has all parameters concerning control states of the engine, such test selection is enabled.

Accordingly, in this embodiment, the verification result check and test selection unit 3a of the MPU 3, by the processing of FIG. 4 (FIGS. 4 and 5), during normal mode, selects tests (tests of ID=1, 2) of processing performed during the normal mode more frequently than tests (test of ID=3, 4) of processing performed at fail-safe. Conversely, during the fail-safe mode, it selects tests (test of ID=3, 4) of processing executed during the fail-safe mode more frequently than tests (test of ID=1, 2) of processing performed during the normal mode. That is, tests of processing performed during the current control mode are selected more frequently than tests of processing performed during other control modes. Such test selection corresponding to control modes enables quick detection of abnormality related to the current control mode.

Since the monitor IC 5 transmits the test result verification result being the result of determining the correctness or incorrectness of the test result from the MPU 3 to the MPU 3, the MPU 3 can also check whether any abnormality exists, from the test result verification result from the monitor IC 5.

The verification result check and test selection unit 3a of the MPU 3, by the processing of FIG. 7, basically sets the final test result to "OK" if the test result verification result from the monitor IC 5 is "OK." It sets the final test result to "NG" if the test result verification result from the monitor IC 5 is "NG." When the final test result is "NG," the same test as the previous one is selected (S155 of FIG. 3). Therefore, when the test result of the test is determined as "NG" in the monitor IC 5 (when the determination of S870 of FIG. 1 is made as "NO"), the test is run again, and an abnormal condition can be verified not once but successively plural times. Furthermore, in comparison with the running of a re-test after a round of all types of tests, there is an advantage in that time until abnormality is determined can be reduced.

The MPU 3 transmits the test ID of the test run this time to the monitor IC 5 along with the test result. The monitor IC 5 sets the expected value of the test result from the MPU 3 based on the test ID from the MPU 3 (S865), and compares the expected value with the test result to determine the correctness or incorrectness of the test result (S870). Therefore, in comparison with, for example, the transmission of the expected value for determining correctness or incorrectness along with the test result from the MPU 3 to the monitor IC 5, the accuracy of determining correctness/incorrectness by the monitor IC 5 can be increased.

In the above embodiment, the monitor IC 5 selects one corresponding to the test ID from among plural expected values for determining correctness or incorrectness stored in advance. However, expected values for determining correctness or incorrectness may be computed according to predetermined operation rules from the value of test ID.

In the ECU 1 of the embodiment, the monitor IC 5 transmits the test ID to the MPU 3 along with the test result verification result. The verification result check and test selection unit 3a of the MPU 3, when selecting the test ID of the same test as the previous one, selects the test ID from the monitor IC 5 as the test ID of the same test as the previous one. Therefore, this makes it possible to prevent the discrepancy between test IDs recognized in the MPU 3 and the monitor IC 5, assuring re-test of the same test as the previous one, if desired.

When the monitor IC 5 determines that the previous test result from the MPU 3 is "error" but the same test ID as the previous one is not transmitted from the MPU 3 (S860: NO), the monitor IC 5 determines that the MPU 3 is abnormal, and sets the test result verification result to "NG." As a result, abnormality of the function of the MPU 3 to run a re-test can be detected.

Since the monitor IC 5 has an all test run verification function by S810 to S850 of FIG. 11, it can detect a fault of the MPU 3 such as "a specific test is not run." The all test run verification function can respond to a change in a transmission order of test IDs from the MPU 3.

Each time a test ID changes from other than five to five, the MPU 3 transmits the test result for verifying NG determination to be determined intentionally as "error" to the monitor IC 5 (S635), and determines by S510, S515, and S530 of FIG. 7 whether the test result verification result from the monitor IC 5 to the test result is "NG." Otherwise, it determines the result as abnormality (S510:YES→S515:YES→S540).

Therefore, the MPU 3 can check whether the correctness/incorrectness function of the monitor IC 5 that determines correctness or incorrectness of the test result from the MPU 3 is normal.

Furthermore, the monitor IC 5 has a function (S745) to count up the error count ECic2 each time it determines that the test result from the MPU 3 is "error," and transmits the error count ECic2 to the MPU 3 along with the test result verification result. The MPU 3 determines by S535 of FIG. 7 whether the error count ECic2 transmitted from the monitor IC 5 along with the test result verification result for the test result for verifying NG determination is normally counted up. Otherwise, it determines as "abnormal" (S535:NO→S540). Therefore, the MPU 3 can check whether the count-up function of the monitor IC 5 to count up the error count ECic2 is normal.

In the above embodiment, the verification result check and test selection unit 3a in the MPU 3 operates as a test selection means. Of processing performed by the MPU 3, S635 of FIG. 8 and S510, S515, and S530 of FIG. 7 operate as IC determination function test means. Of processing performed by the MPU 3, S635 of FIG. 8 and S535 of FIG. 7 operates as IC count function test means.

Second Embodiment

In a second embodiment, an ECU has the same hardware configuration as the ECU 1 of the first embodiment, and hence the reference numerals of individual units are the same as those in the first embodiment.

Figure 16:
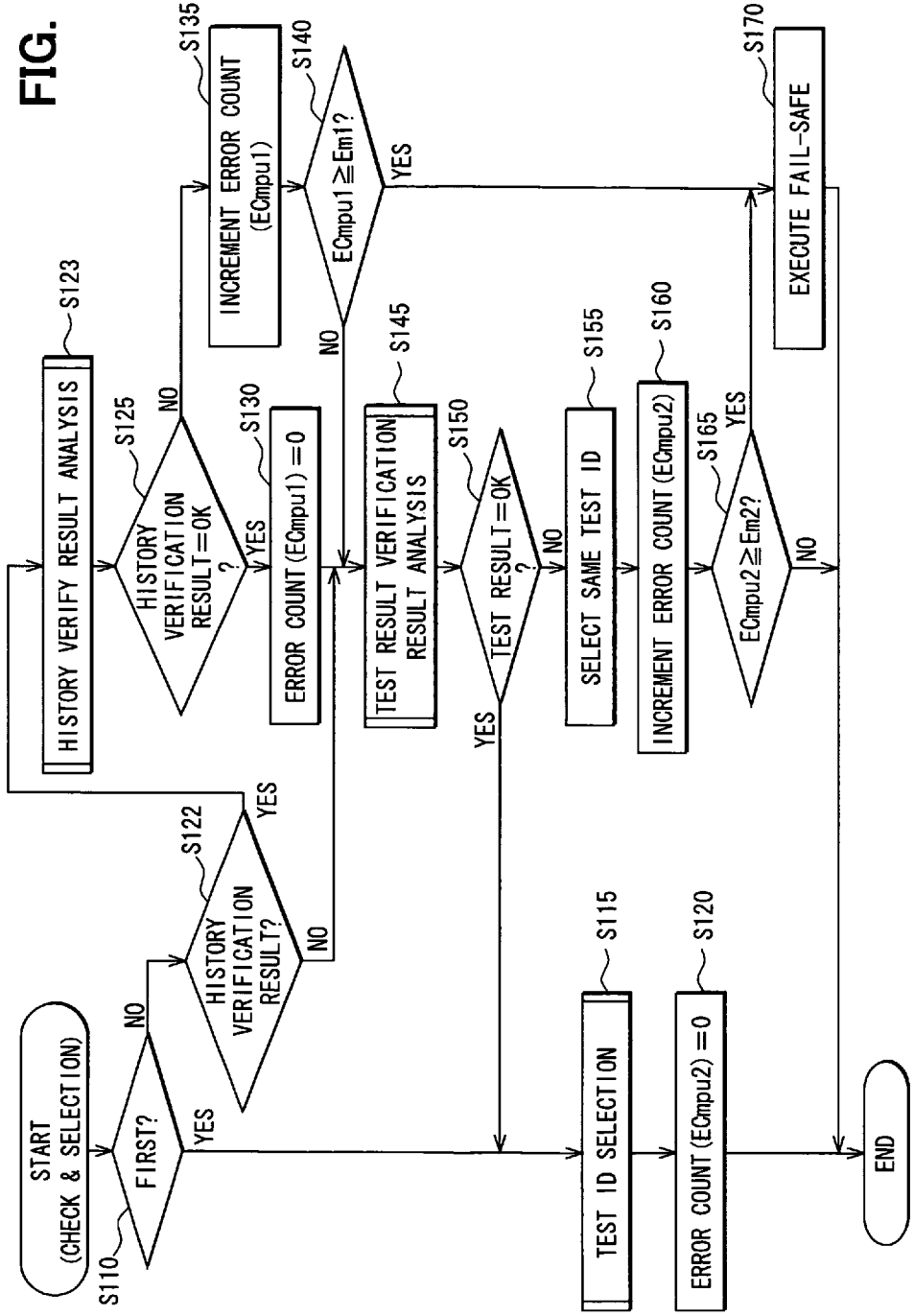
FIG. 16 is a flowchart showing processing of a verification result check and test selection unit in an MPU of a second embodiment of the present invention.

In contrast to the ECU 1 of the first embodiment, the MPU 3 runs tests for checking whether the all test run verification function (S810 to S850) of the monitor IC 5, the function to reset the error count ECic1, and the count-up function (S715 to S725) are normal. The monitor IC 5 transmits a history verification result to the MPU 3 in S755 of FIG. 10 along with the error count ECic1. Therefore, the MPU 3 executes the processing of a verification result check and test selection unit 3a shown in FIG. 16 instead of the processing of FIG. 3. The processing of FIG. 16 is different from the processing of FIG. 3 in the following points (1-1) to (1-3).

(1-1): S115 performs test ID selection processing of FIG. 17 in place of the processing of FIG. 4.

(1-2): When S122 determines that the history verification result is received, S123 performs the processing of analyzing history verification results of FIG. 18, and then proceeds to S125.

Details of the processing of analyzing history verification results will be described later. The processing determines the history verification final result being an inspection result obtained by analyzing the history verification result received from the monitor IC 5 and the error count ECic1 to comprehensively check whether tests of all types have been run in the MPU 3, whether the all test run verification function of the monitor IC 5 is normal, and whether the reset function of the error count ECic1 and the count-up function in the monitor IC 5 are normal.

(1-3): S125 checks whether the history verification final result determined this time in S123 instead of the history verification result received from the monitor IC 5 is "OK" indicating "normal."

Figure 17:
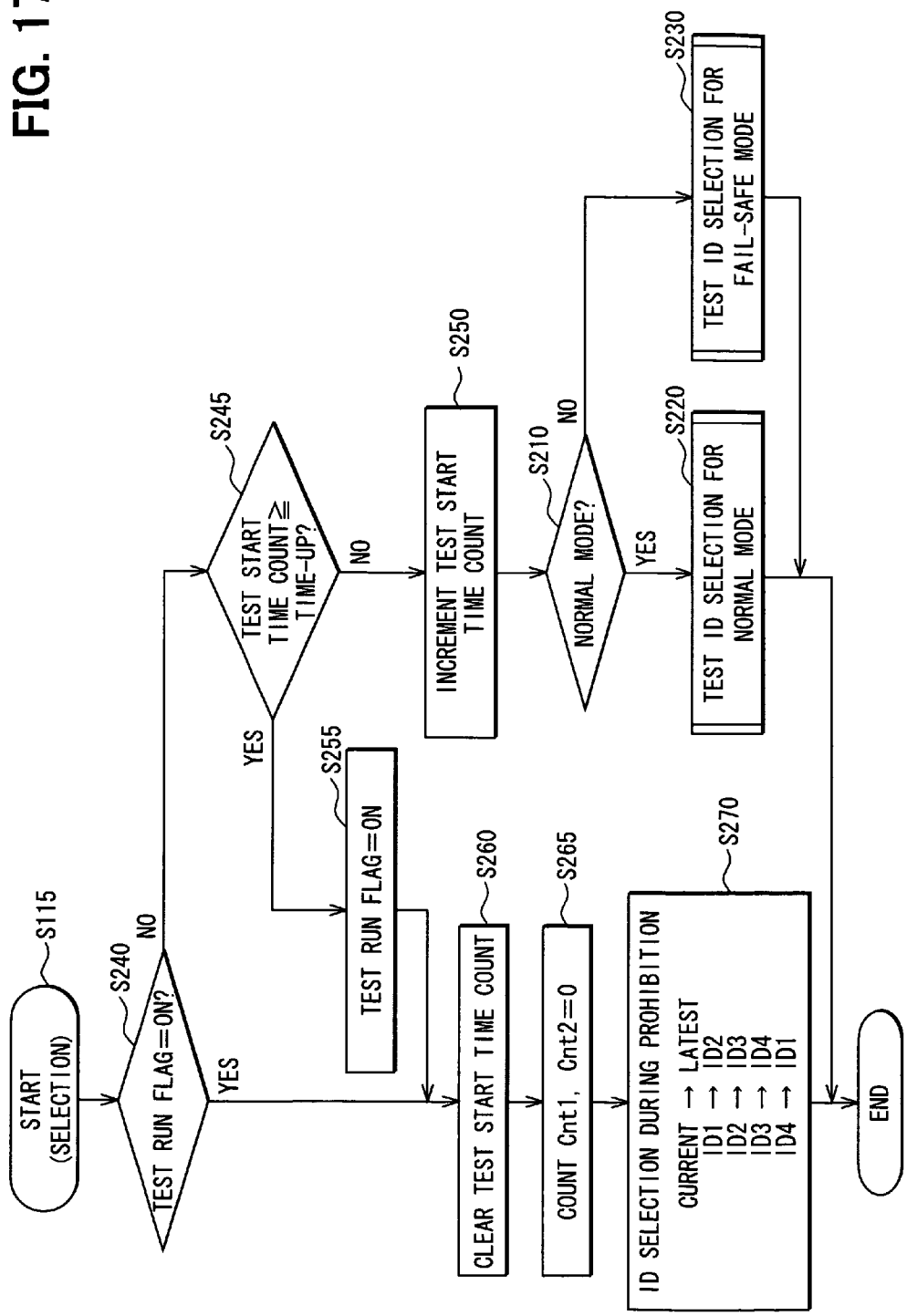
FIG. 17 is a flowchart showing test ID selection processing in FIG. 16.

The following describes the test ID selection processing of FIG. 17 performed in S115 of FIG. 16. The test ID selection processing of FIG. 17 is an addition of the processing of S240 to S270 to the test ID selection processing (S210 to S230) of FIG. 4.

As shown in FIG. 17, in the test ID selection processing S115, S240 checks whether the test run flag is ON. The MPU 3, to check whether the all test run verification function of the monitor IC 5 is normal, intentionally prohibits the transmission of any (five of one to five in this embodiment) of test IDs of all types to the monitor IC 5. The test run flag indicates the period (that is, a test period of the all test run verification function hereinafter referred to as a specific ID transmission prohibition period) during which the transmission of the test ID=5 is prohibited. The test run flag is turned on in S255 described later, and turned off in S940 or S950 of FIG. 18 described later.

When S240 determines that the test run flag is not ON, control proceeds to S245 to check whether a value of a test start time counter (value of a test start time count) is equal to or greater than a time-up value. Otherwise, control proceeds to S250 to increment the test start time count. Then, control proceeds to S210. The test start time count is for measuring elapsed time after the end of the previous specific ID transmission prohibition period. The time-up value is for determining after the end of the previous specific ID transmission prohibition period until the next specific ID transmission prohibition period is started. For example, it is set to a value several times or several tens times the specific time Thc. The processing of S210 to S230 is the same as those in FIG. 4. When the processing of S220 or S230 terminates, the test ID selection processing in S115 in FIG. 16 terminates. On the other hand, when S245 determines that the test start time count is equal to or greater than the time-up value, control proceeds to S255 to turn on the test run flag, and then proceeds to S260.

When S240 determines that the test run flag is ON, control proceeds to S260. S260 clears the test start time count to zero, and S265 initializes the first count Cnt1 used in processing of S220 (test ID selection processing for normal mode: FIG. 5), and the second count Cnt2 used in processing of S230 (test ID selection processing for fail-safe mode: FIG. 6) to zero. S270 performs ID selection processing during the periods of specific ID transmission prohibition. The ID selection processing during the periods of specific ID transmission prohibition sets the latest test ID to two if the current test ID (that is, a test ID transmitted last) is one, sets the latest test ID to three if the current test ID is two, sets the latest test ID to four if the current test ID is three, and sets the latest test ID to one if the current test ID is not any of one to three. When the processing of S270 terminates, the test ID selection processing in S115 in FIG. 16 terminates.

That is, in the test ID selection processing of FIG. 17, although the test ID is selected by the processing of the same S210 to S230 as that of the first embodiment until the test start time count reaches the time-up value (S245:NO, when the test start time count reaches the time-up value, the test run flag is turned on (S255) along with clearing the test start time count (S260). After that, until the test run flag is turned off in S940 or S950 of FIG. 18, the test ID is changed between one and four except five by the processing of S270.

Figure 18:
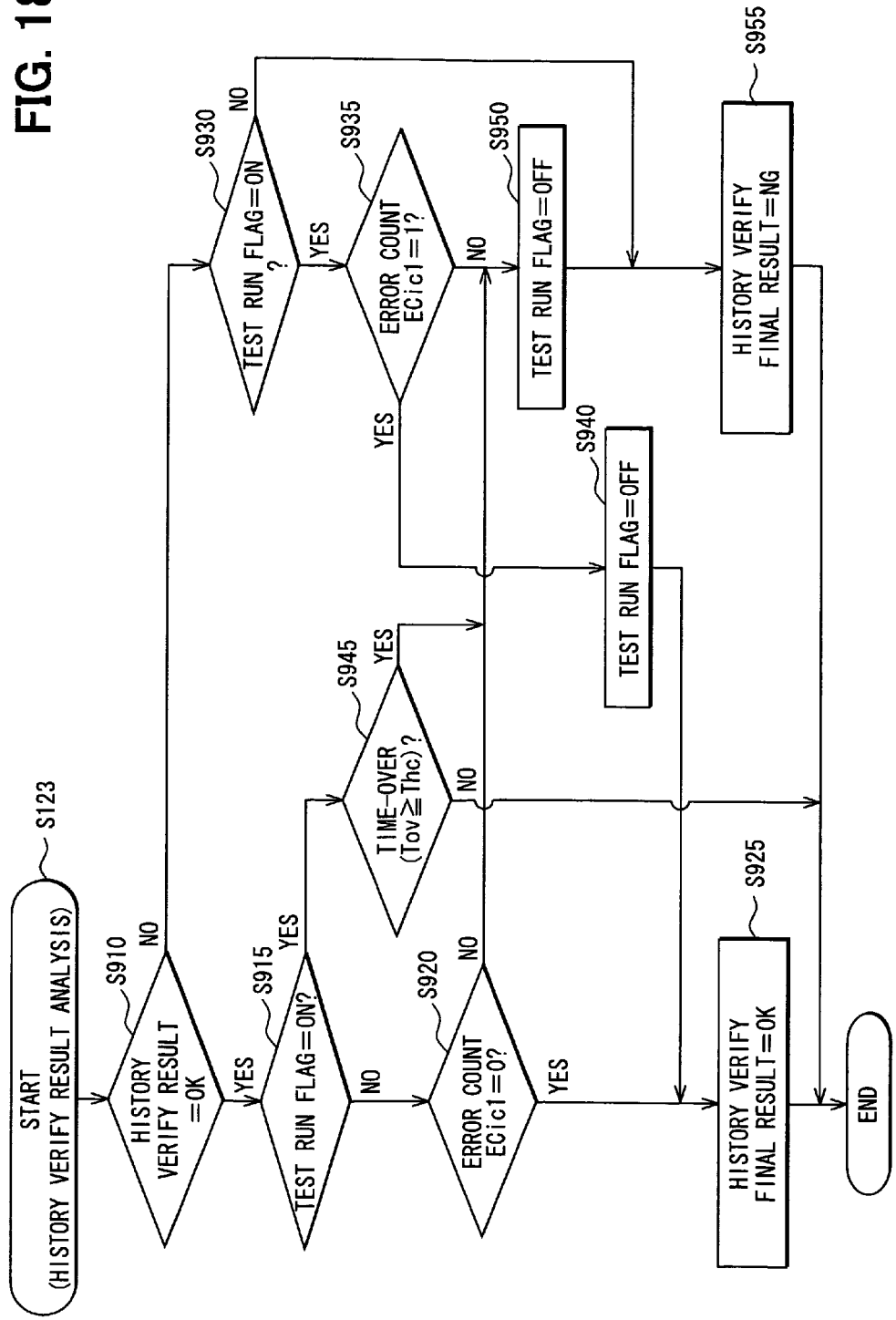
FIG. 18 is a flowchart showing the processing of analyzing a history verification result in FIG. 16.

The analysis processing of history verification result is performed in S123 of FIG. 16, which is more fully shown in FIG. 18. In this analysis processing of history verification result, S910 checks whether the history verification result received from the monitor IC 5 is "OK." If so, control proceeds to S915 to check whether the test run flag is ON. Otherwise, control proceeds to S920 to check whether the error count ECic1 received from the monitor IC 5 along with the history verification result is zero. If so, control proceeds to S925. S925 sets the history verification final result to "OK"

indicating "normal," and then the analysis processing of history verification result terminates.

When S915 determines that the test run flag is ON, control proceeds to S945 to check whether a prescribed time Tov has elapsed after the test run flag is turned on. The prescribed time Tov is longer than the prescribed time Thc (96 ms) described previously. If the transmission of any test ID is prohibited for the time, the history verification result is to be set to "NG" by the all test run verification function of the monitor IC 5. In this embodiment, this time is set to 112 ms, which is less than twice the specific time Thc.

When S945 determines that the prescribed time Tov does not elapse, although the transmission of test ID=5 is prohibited for the period, since the all test run verification function of the monitor IC 5 cannot yet be determined to be abnormal, the analysis processing of history verification result terminate immediately. In this case, the history verification final result remains the same as the previous setting value.

On the other hand, when S945 determines that the prescribed time Tov has elapsed, since the prescribed time Tov has elapsed after the transmission of test ID=5 is stopped, but the history verification result from the monitor IC 5 is "OK" instead of "NG," it determines that the all test run verification function of the monitor IC 5 is abnormal. Control proceeds to S950 to turn the test run flag OFF. S955 sets the history verification final result to "NG" indicating "abnormal," and then the analysis processing of history verification result terminates.

When S920 determines that the error count ECic1 is not zero, it determines that abnormality occurs in the reset function of the error count ECic1 in the monitor IC 5 (S720), and proceeds to S950. Therefore, also in this case, the test run flag is turned off and the history verification final result is set to "NG."

On the other hand, when S910 determines that the history verification result from the monitor IC 5 is not "OK," control proceeds to S930 to check whether the test run flag is ON. If so, since the transmission of test ID=5 is prohibited in terms of period and the all test run verification function of the monitor IC 5 is normal, it can be determined that the history verification result from the monitor IC 5 is not "OK" (that is, "NG"). Therefore, control proceeds to S935 to check whether the error count ECic1 received from the monitor IC 5 is one. If the error count ECic1 is one, since it can be determined that the count-up function (S725) of the error count ECic1 in the monitor IC 5 is normal, control proceeds to S940 to turn the test run flag off, and then proceeds to S925. Therefore, in this case, the history verification final result is set to "OK."

On the other hand, when S930 determines that the test run flag is not ON, it means that although the transmission of test ID=5 is not prohibited, the history verification result from the monitor IC 5 was "NG." S930 determines that tests of all types are not truly run, and proceeds to S955. Therefore, in this case, the history verification final result is set to "NG."

When S935 determines that the error count ECic1 is not one, it determines that abnormality occurs in the count-up function (S725) of the error count ECic1 in the monitor IC 5, control proceeds to S950 to turn the test run flag off, and then proceeds to S955. Therefore, also in this case, the history verification final result is set to "NG."

In the second embodiment, the history verification final result set to "OK" or "NG" in the processing of FIG. 18 is referred to in S125 of FIG. 16, when the continuous number of times the history verification final result is set to "NG" becomes equal to or greater than a prescribed value, fail-safe processing is performed (S140:YES➔S170)❍

According to the ECU 1 of the second embodiment, the MPU 3 can detect that the all test run verification function of the monitor IC 5 has become abnormal. Furthermore, the MPU 3 can detect that the function to reset the error count ECic1 in the monitor IC 5 and the function to count it up have become abnormal. The processing of S240 to S270 in FIG. 17 and the processing of S910, S915, S945, S950 and S955 in FIG. 18 operate as all test run verification function testing means. On the other hand, S935 of FIG. 18 checks whether the error count ECic1 is one or greater. If so, control may proceed to S940, determining as normal.

Third Embodiment

Figure 19:
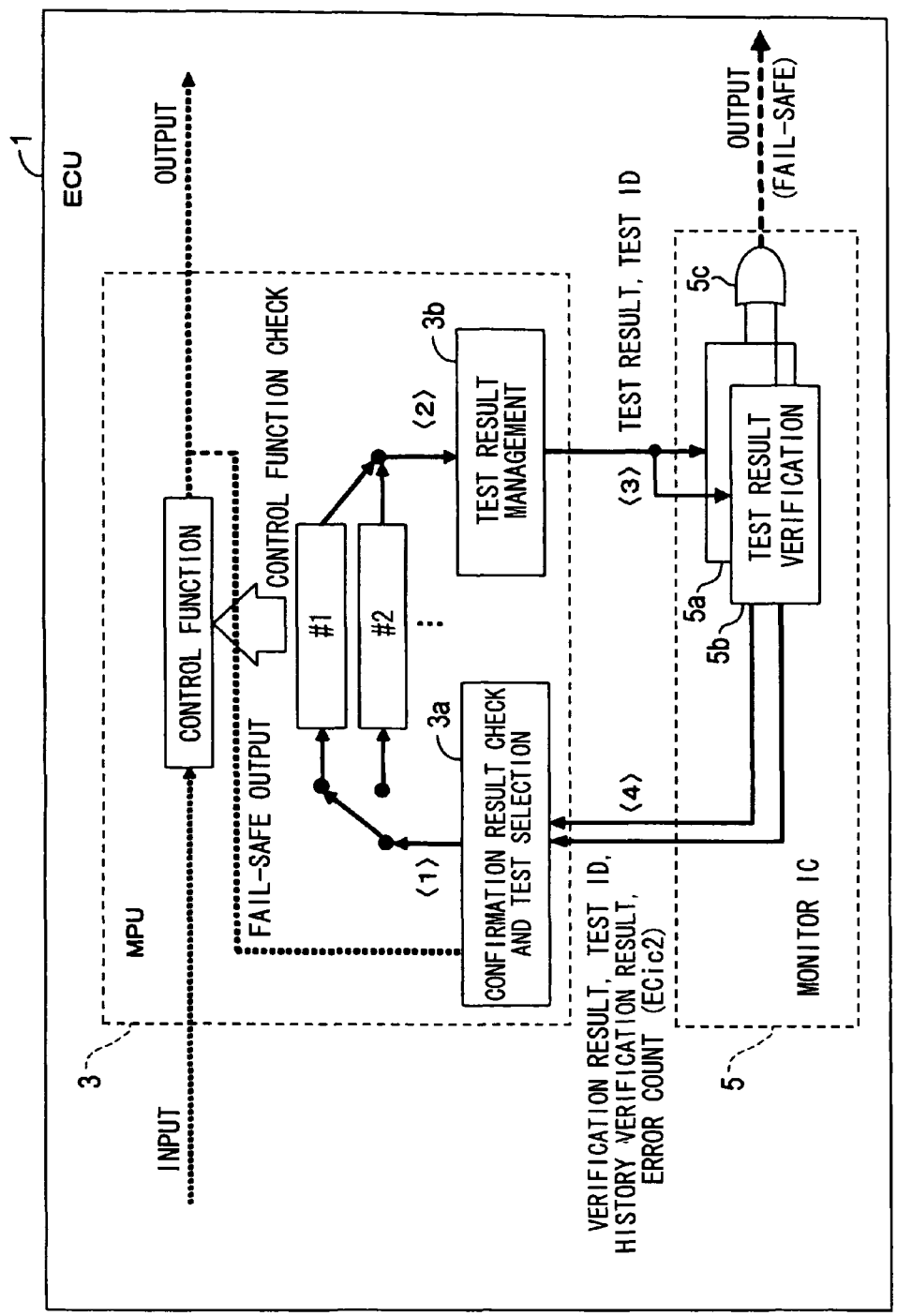
FIG. 19 is a block diagram showing the construction of an ECU of a third embodiment.

In a third embodiment shown in FIG. 19, the ECU 1 is different from the ECU 1 of the first embodiment in the following points (2-1) to (2-5).

(2-1): The monitor IC 5 includes, in addition to the test result verification unit 5a, a test result verification unit 5b having the same construction and functions as the test result verification unit 5a. The two test result verification units 5a and 5b operate in parallel.

The fail-safe signal outputted in the processing of S760 in FIG. 10 by each of the test result verification units 5a and 5b is outputted to the outside of the monitor IC 5 via an OR circuit 5c. In short, if at least one of two test result verification units 5a and 5b outputs the fail-safe signal, the signal is outputted from the monitor IC 5 to reduce the output of the engine. An AND circuit may be provided in place of the OR circuit 5c. The two test result verification units 5a and 5b correspond to plural circuit blocks.

(2-2): The MPU 3 performs the processing of analyzing the test result verification results shown in FIG. 20 in S145 of FIG. 3 in place of the processing of FIG. 7.

Figure 20:
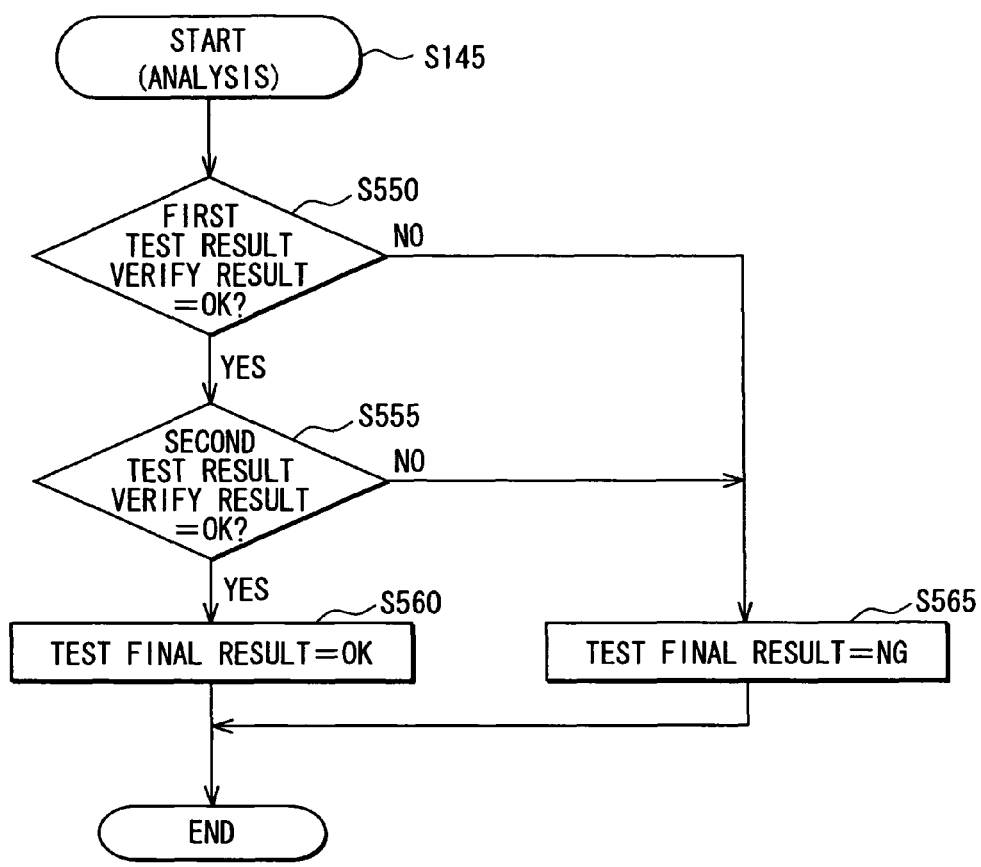
FIG. 20 is a flowchart showing the processing of analyzing test result verification results of the third embodiment.

In the processing of FIG. 20, S550 checks whether a first test result verification result received from the monitor IC 5 is "OK." The first test result verification result is one transmitted from the test result verification unit 5a. If the first test result verification result is "OK," S555 checks whether the second test result verification result received from the monitor IC 5 is "OK." The second test result verification result is one transmitted from the test result verification unit 5b. If the second test result verification result is "OK," control proceeds to S560 to set the final test result to "OK," and then the processing of analyzing the test result verification result terminates. When S550 determines that the first test result verification result is "NG" or S555 determines that the second test result verification result is "NG," control proceeds to S565 to set the final test result to "NG," and then the processing of analyzing a test result verification result terminates.

Thus, in the processing of FIG. 20, if all test result verification results transmitted from the two test result verification units 5a and 5b are "OK," the final test result is set to "OK," determining as normal. If any one of the test result verification results is "NG," the final test result is set to "NG," determining as abnormal.

Therefore, although in the first embodiment, the MPU 3 transmits the test result for verifying NG determination to the monitor IC 5 to confirm that the test result verification result for the test result is "NG," according to the third embodiment, without performing such processing, influence by abnormality of the correctness/incorrectness function of the monitor IC 5 can be eliminated. This is because abnormality occurs in any of the two test result verification units 5a and 5b in the monitor IC 5 and the test result from the MPU 3 to the monitor IC 5 is truly wrong. However, even if the test result verification result from the faulty test result verification unit to the MPU 3 becomes "OK," if the test result verification result from another test result verification unit is "NG," the MPU 3 is not incorrectly determined as normal (that is, the final test result is not "OK.") Therefore, in the third embodiment, test ID=5 does not exist. In the MPU 3, however, the test ID is set to any of one to four, and the test ID=1 to 4 is transmitted to the monitor IC 5. Therefore, differences from the first embodiment are summarized as (2-3) to (2-5).

(2-3): The MPU 3, in S220 of FIG. 4, performs the test ID selection processing for normal mode shown in FIG. 21 in place of the processing of FIG. 5. In S230 of FIG. 4, in place of the processing of FIG. 6, the MPU 3 performs the test ID selection processing for fail-safe mode shown in FIG. 22.

Figure 21:
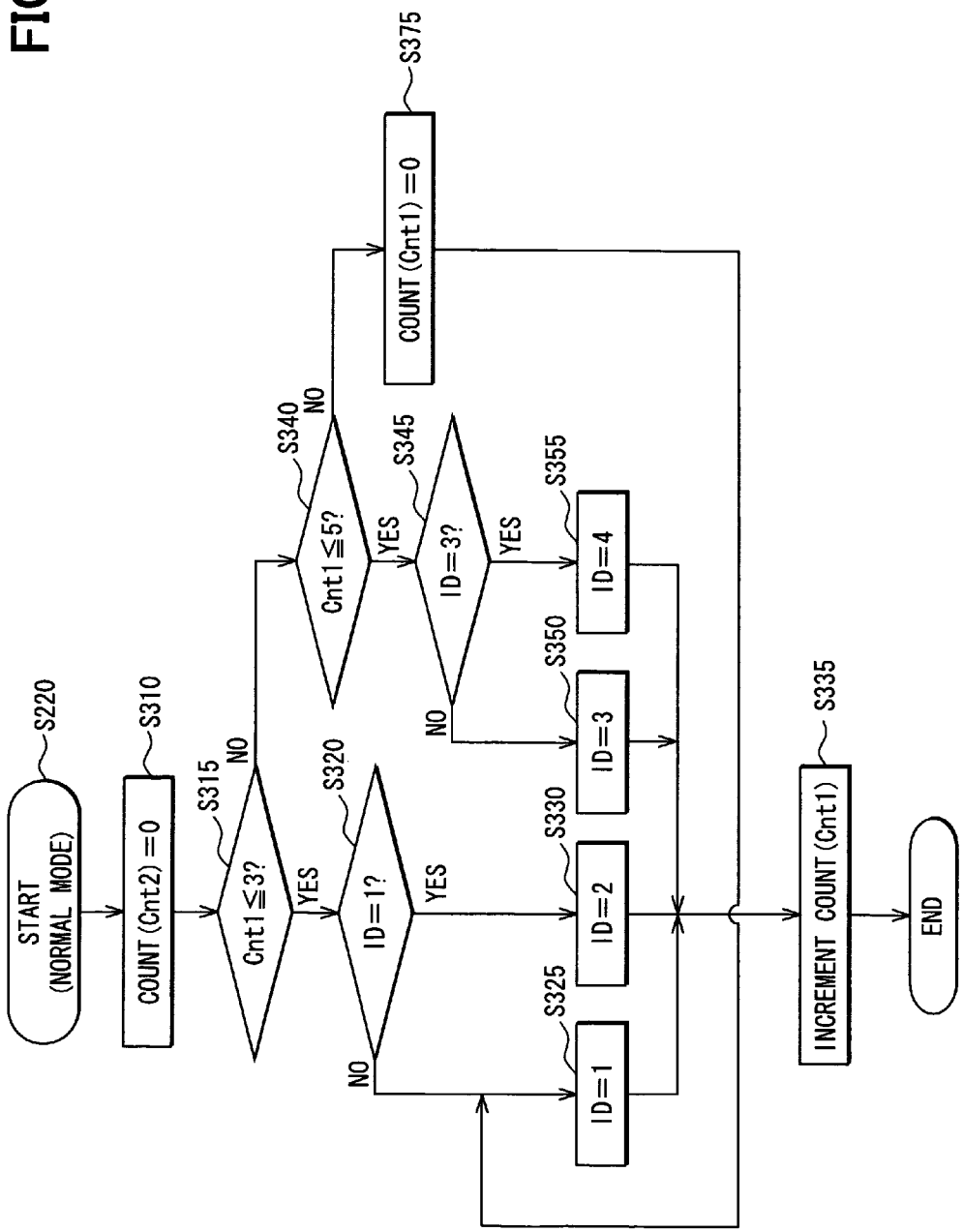
FIG. 21 is a flowchart showing test ID selection processing for normal mode of the third embodiment.

Processing of FIG. 21 is different from the processing of FIG. 5 in that S360 to S370, and S380 are not provided. When S340 determines that the first count Cnt1 is not five or less, control proceeds to S375 to return the first count Cnt1 to zero, and then proceeds to S325 to set the test ID to one. Therefore, test IDs are selected in the order of "1➔2➔1➔2➔3➔4➔1➔2➔1➔2➔3➔4➔1."

Figure 22:
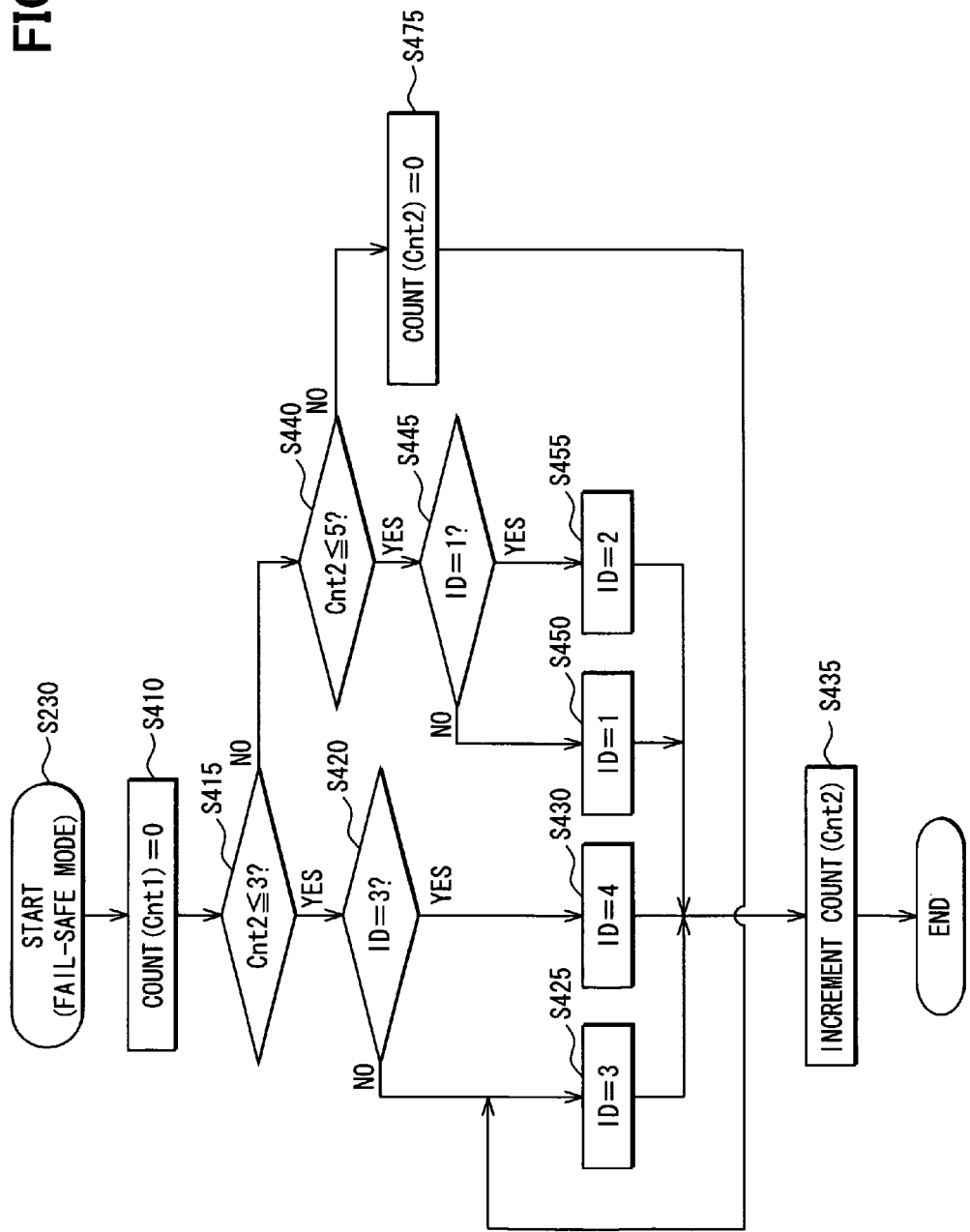
FIG. 22 is a flowchart showing test ID selection processing for fail-safe mode of the third embodiment.

Processing of FIG. 22 is different from the processing of FIG. 6 in that S460 to S470, and S480 are not provided. When S440 determines that the second count Cnt2 is not five or less, control proceeds to S475 to return the second count Cnt2 to zero, and then proceeds to S425 to set the test ID to three. Therefore, the test IDs are selected in the order of "3➔4➔3➔4➔1➔2➔3➔4➔3➔4➔1➔2➔3."

(2-4): The MPU 3 performs the processing of FIG. 23 in place of the processing of FIG. 8 as the processing of the test result management unit 3b.

Figures 23, 24:
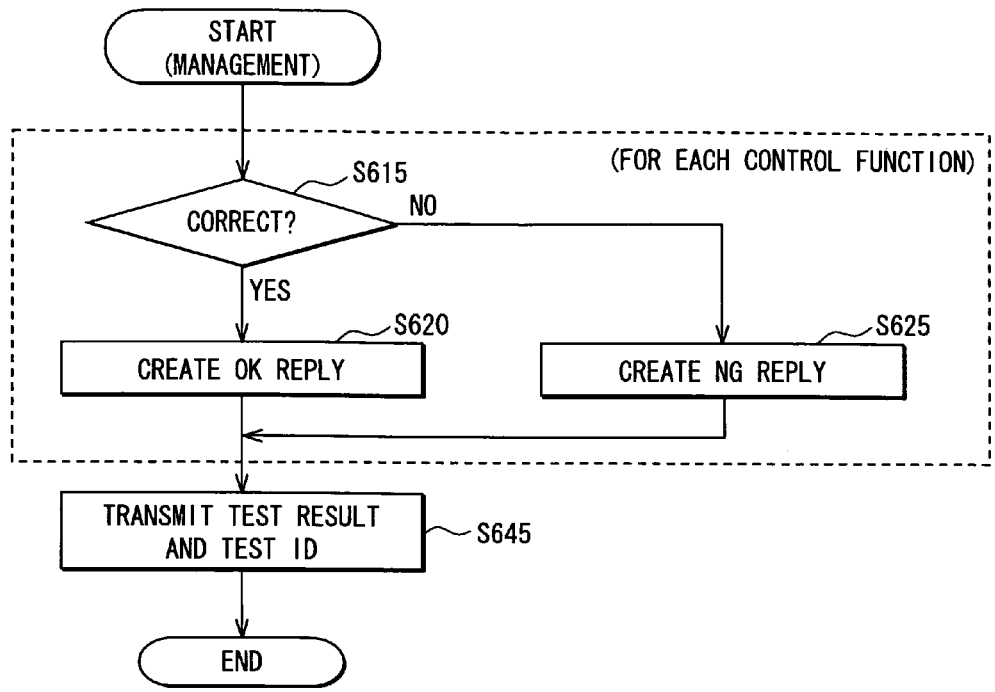
FIG. 23 is a flowchart showing processing of a test result management unit in an MPU of the third embodiment.
FIG. 24 is a drawing for explaining the rules of creating a test result in the MPU of the third embodiment and the rules of setting an expected value for determining correctness or incorrectness in a monitor IC.

The processing of FIG. 23 is different from the processing of FIG. 8 in that S610 and S630 to 640 are not provided. In the MPU 3, the rules shown in FIG. 9B are not stored, and only the same rules of FIG. 24 as those of FIG. 9A are stored. S620 or S625 of FIG. 23 uses the rules of FIG. 24 to create the test result. Therefore, a procedure for creating the test result in S620 or S625 of FIG. 23, and the contents of the test result created are the same as those in the first embodiment.

(2-5): Each of the test result verification units 5a and 5b in the monitor IC 5 stores the same rules of FIG. 24 as those in the MPU 3 in place of the rules of FIG. 12. In the rules of FIG. 24, information about test ID=5 is deleted in the rules of FIG. 12. Each of the test result verification units 5a and 5b selects the expected value for determining correctness or incorrectness by using the rules of FIG. 24 in S865 of FIG. 11.

As another different point from the first embodiment, the MPU 3 determines in S125 of FIG. 3 whether the history verification result from one of the two test result verification units 5a and 5b (e.g., the test result verification unit 5a) in the monitor IC 5 is "OK." Likewise, the MPU 3 sets in S155 of FIG. 3 the test ID sent from one of the two test result verification units 5a and 5b (e.g., the test result verification unit 5a) as the same test ID (that is, rest ID of re-test) as the previous one. In the third embodiment, the test result verification units 5a and 5b of the monitor IC 5 may not transmit the error count ECic2 to the MPU 3.

According to the ECU 3 of the third embodiment, in comparison with the first embodiment, the processing of the MPU 3 for verifying the operation of the monitor IC 5 can be made simpler. The MPU 3 may be constructed to compare the test result verification results transmitted from the test result verification units 5a and 5b of the monitor IC 5 to determine that the monitor IC 5 is faulty unless all of them are the same. In short, if the comparison of information from the test result verification units 5a and 5b results in mismatch or disagreement, it can be determined that any of them is abnormal. Therefore, for example, the MPU 3 may be constructed to determine that the monitor IC 5 is abnormal unless all of test IDs transmitted from the test result verification units 5a and 5b of the monitor IC 5 are the same after comparing them. Still, the MPU 3 may be constructed to determine that the monitor IC 5 is abnormal unless all of the history verification results transmitted from the test result verification units 5a and 5b of the monitor IC 5 are the same after comparing them. By this construction, like the second embodiment, whether the all test run verification function of the monitor IC 5 is normal can be verified in the MPU 3.

The present invention is not limited to the foregoing embodiments and modifications, but may be implemented in various ways without departing from the purport of the present invention.

For example, in place of two control modes, there may be three control modes or more. Without providing the NG expectation tests, only the OK expectation tests may be run. In this case, the test ID=1, 2 may be integrated to one test ID, and the test ID=3, 4 may be integrated to one test ID. The MPU 3 may transmit the result of the test to the monitor IC 5 as a test result without editing it, while the monitor IC 5 may determine correctness or incorrectness for the test result representative of the test result.

What is claimed is:

1. An electronic control unit comprising:
    a microcomputer that performs processing for controlling a control target; and
    an IC that monitors operation of the microcomputer, wherein:
    the microcomputer includes a test selection means for selecting a test to verify functions of the microcomputer, and runs the test selected and transmits a test result indicating a result of the test to the IC;
    the IC determines correctness/incorrectness of the test result transmitted from the microcomputer;
    the IC transmits to the microcomputer a verification result, which is a result of checking whether the test result is correct or incorrect;
    the microcomputer transmits a test ID, which is identification information of a test run of this time, to the IC along with the test result; and
    the IC sets an expected value of the test result from the microcomputer, based on the test ID from the microcomputer, and compares the expected value with the test result to check whether the test result is correct or incorrect.

2. The electronic control unit according to claim 1, wherein:
    the test selection means, according to a control mode of the control target, selects a test of processing performed in a current control mode more frequently than tests of processing performed in other control modes.

3. The electronic control unit according to claim 1, wherein:
    the test selection means, according to the verification result from the IC, selects a test different from a previous one as a next test if the verification result is "correct," and selects the same test as the previous one as the next test if the verification result is "incorrect."

4. The electronic control unit according to claim 3, wherein:
    the IC transmits the test ID of a test corresponding to the verification result to the microcomputer along with the verification result; and the test selection means selects, as the same test as the previous one, a test corresponding to the test ID sent from the IC along with the verification, when the verification result is "incorrect."

5. The electronic control unit according to claim 3, wherein:
the IC determines that the microcomputer is abnormal, when determining that the previous test result from the microcomputer is "incorrect" but the same test ID as the previous one is not transmitted from the microcomputer.

6. The electronic control unit according to claim 3, wherein:
the IC stores the test ID from the microcomputer, each time a specific period elapses, checks whether test IDs of all types have been transmitted from the microcomputer for a duration of the specific period, and has an all test run verification function to determine that the microcomputer is abnormal unless the test IDs of all types have been transmitted.

7. The electronic control unit according to claim 6, wherein:
the IC transmits a verification result of the all test run verification function to the microcomputer; and
the microcomputer has an all test run verification function test means that prohibits any of test IDs of all types and a test result corresponding to a prohibited test ID from being transmitted to the IC, and that determines that the all test run verification function is abnormal even when a specific period longer than the specific period has elapsed in that state, unless a verification result indicating abnormality is transmitted as a verification result of the all test run verification function from the IC.

8. The electronic control unit according to claim 1, wherein:
the microcomputer has an IC determination function test means that transmits as the test result a test result to be determined as "error" in the IC when a specific IC test run timing arrives, and checks whether the verification result from the IC for the test result is "error."

9. The electronic control unit according to claim 1, wherein:
the IC includes a plurality of circuit blocks that check whether a test circuit from the microcomputer is correct or incorrect, and transmit verification results of correctness/incorrectness to the microcomputer; and
the microcomputer determines as normal if all verification results transmitted from the plural circuit blocks are "correct."

10. The electronic control unit according to claim 1, wherein:
the test selection means selects the test without referring to the verification test from the IC when the test is a first test, and selects the test with reference to the verification test from the IC when the test is a second and subsequent tests; and
the first test is selected when the microcomputer runs the test for the first time after being activated, and the second and subsequent tests are selected after the microcomputer has run the first test.

11. The electronic control unit according to claim 1, wherein:
the microcomputer performs a self-check of the test result after running the test selected and transmits a result of the self-check as the test result to the IC.

12. An electronic control unit comprising:
a microcomputer that performs processing for controlling a control target; and
an IC that monitors operation of the microcomputer,
wherein the microcomputer includes a test selection means for selecting a test to verify functions of the microcomputer, and runs the test selected and transmits a test result indicating a result of the test to the IC;
wherein the IC determines correctness/incorrectness of the test result transmitted from the microcomputer;
wherein the IC transmits to the microcomputer a verification result, which is a result of checking whether the test result is correct or incorrect;
wherein the test selection means, according to the verification result from the IC, selects a test different from a previous one as a next test if the verification result is "correct," and selects the same test as the previous one as the next test if the verification result is "incorrect";
wherein the IC has a function to count up an abnormality determination count each time it determines that the test result from the microcomputer is "error," and transmits the value of the abnormality determination count to the microcomputer along with a determination result; and
wherein the microcomputer has an IC count function test means that, when a specific IC test run time arrives, transmits as the test result a test result to be determined as "error" in the IC, and checks whether the abnormality determination count sent from the IC for the test result along with the determination result is normally added.

13. A method comprising:
performing, by a microcomputer, processing for controlling a control target;
monitoring, by an IC, operation of the microcomputer;
selecting, by the microcomputer, a test to verify functions of the microcomputer;
running, by the microcomputer, the test selected;
transmitting, by the microcomputer, a test result indicating a result of the test to the IC;
determining, by the IC, correctness/incorrectness of the test result transmitted from the microcomputer;
transmitting, by the IC to the microcomputer, a verification result, which is a result of checking whether the test result is correct or incorrect;
transmitting, by the microcomputer to the IC, a test ID, which is identification information of a test run of this time, along with the test result;
setting, by the IC, an expected value of the test result from the microcomputer, based on the test ID from the microcomputer; and
comparing, by the IC, the expected value with the test result to check whether the test result is correct or incorrect.

14. The method according to claim 13, wherein:
the microcomputer, according to a control mode of the control target, selects a test of processing performed in a current control mode more frequently than tests of processing performed in other control modes.

15. The method according to claim 13, wherein:
the microcomputer, according to the verification result from the IC, selects a test different from a previous one as a next test if the verification result is "correct," and selects the same test as the previous one as the next test if the verification result is "incorrect."

16. The method according to claim 13, wherein:
the microcomputer transmits as the test result a test result to be determined as "error" in the IC when a specific IC test run timing arrives, and checks whether the verification result from the IC for the test result is "error."

17. The method according to claim 13, wherein:
the IC counts up an abnormality determination count each time it determines that the test result from the microcomputer is "error," and transmits the value of the abnormality determination count to the microcomputer along with a determination result; and when a specific IC test run time arrives, the microcomputer transmits as the test result a test result to be determined as "error" in the IC, and checks whether the abnormality determination count sent from the IC for the test result along with the determination result is normally added.

18. The method according to claim 13, wherein:
the microcomputer selects the test without referring to the verification test from the IC when the test is a first test, and selects the test with reference to the verification test from the IC when the test is a second and subsequent tests; and the first test is selected when the microcomputer runs the test for the first time after being activated, and the second and subsequent tests are selected after the microcomputer has run the first test.

19. The method according to claim 13, wherein:
the microcomputer performs a self-check of the test result after running the test selected and transmits a result of the self-check as the test result to the IC.

* * * * *